United States Patent [19]

Iwahashi et al.

[11] Patent Number: 4,635,232
[45] Date of Patent: Jan. 6, 1987

[54] SEMICONDUCTOR MEMORY DEVICE

[75] Inventors: Hiroshi Iwahashi; Fujio Masuoka, both of Yokohama, Japan

[73] Assignee: Tokyo Shibaura Denki Kabushiki Kaisha, Japan

[21] Appl. No.: 477,880

[22] Filed: Mar. 23, 1983

[30] Foreign Application Priority Data

Mar. 25, 1982 [JP] Japan ................................ 57-47723

[51] Int. Cl.$^4$ ........................................... G11C 11/40
[52] U.S. Cl. ...................................... 365/200; 371/10
[58] Field of Search ................. 364/200, 900; 365/200; 371/200

[56] References Cited

U.S. PATENT DOCUMENTS 4,365,319 12/1982 Takemae ............................. 365/200
4,392,211 7/1983 Nakano et al. ..................... 365/200
4,485,459 11/1984 Venkateswaran ................. 365/200
4,538,245 8/1985 Smarandoiu et al. .............. 365/200

OTHER PUBLICATIONS

Kokkonen et al., "Redundancy Techniques for Fast Static RAMs", ISSCC Digest of Technical Papers, pp. 80-81, Feb. 18, 1981.

Primary Examiner—Thomas M. Heckler
Attorney, Agent, or Firm—Finnegan, Henderson, Farabow, Garrett & Dunner

[57] ABSTRACT

A semiconductor memory device is disclosed, which comprises a main memory, a decoder for selecting the main memory, an auxiliary memory, transistors connected between the auxiliary memory and the decoder for selecting the auxiliary memory according to the output of the decoder, and circuits for controlling the transistors. The transistors render the main memory inoperative when the auxiliary memory is rendered operative.

10 Claims, 29 Drawing Figures

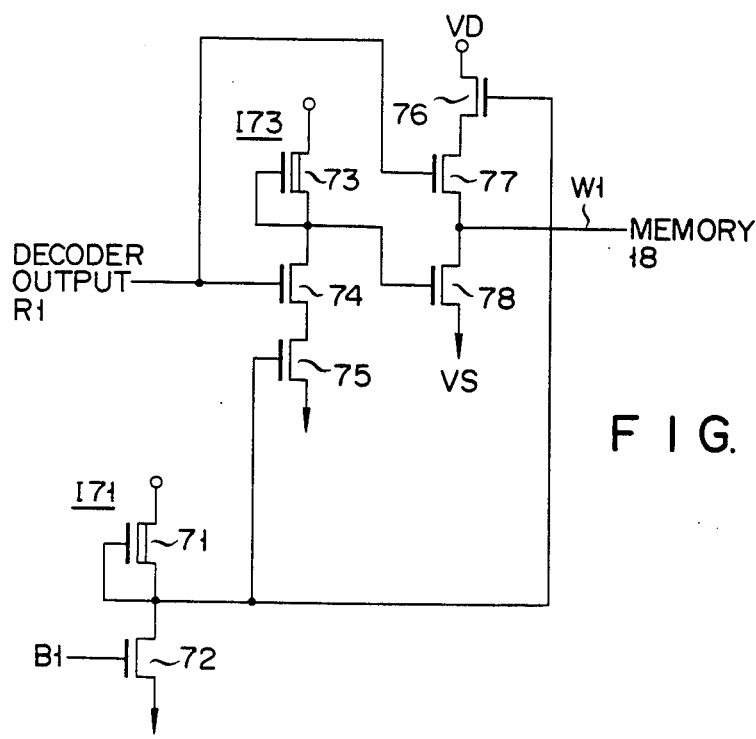
FIG. 10
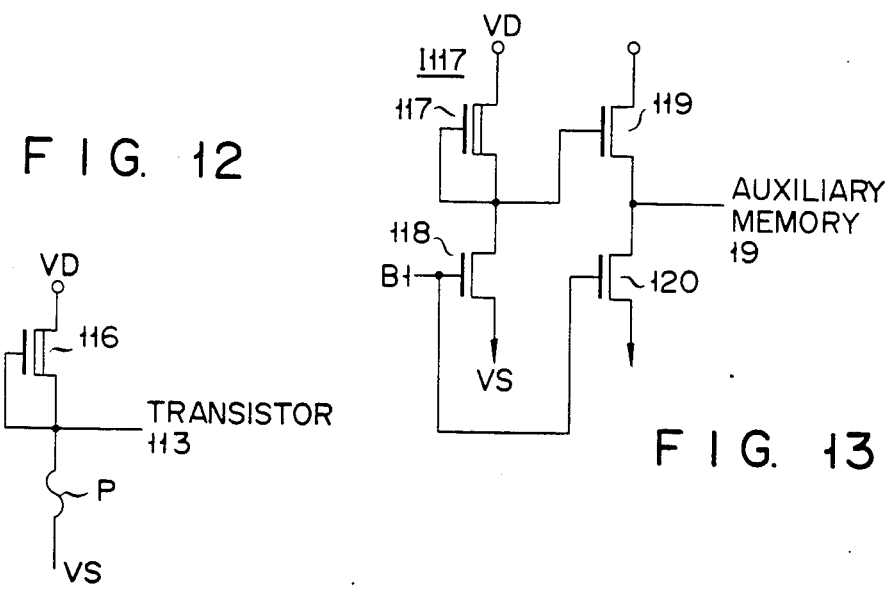
FIG. 12
FIG. 13

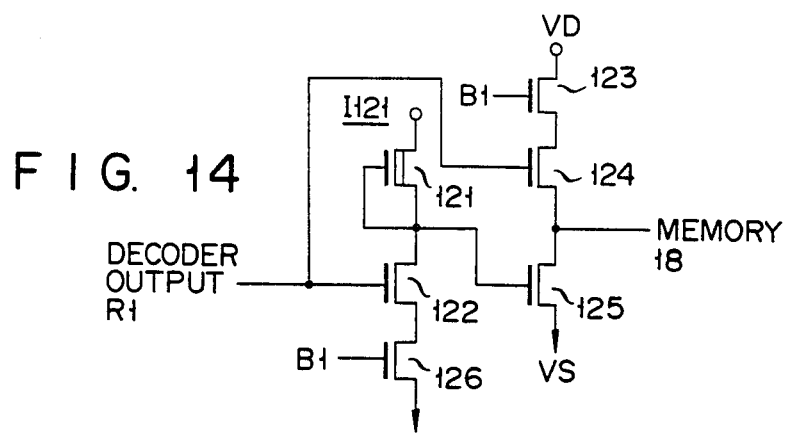
FIG. 14
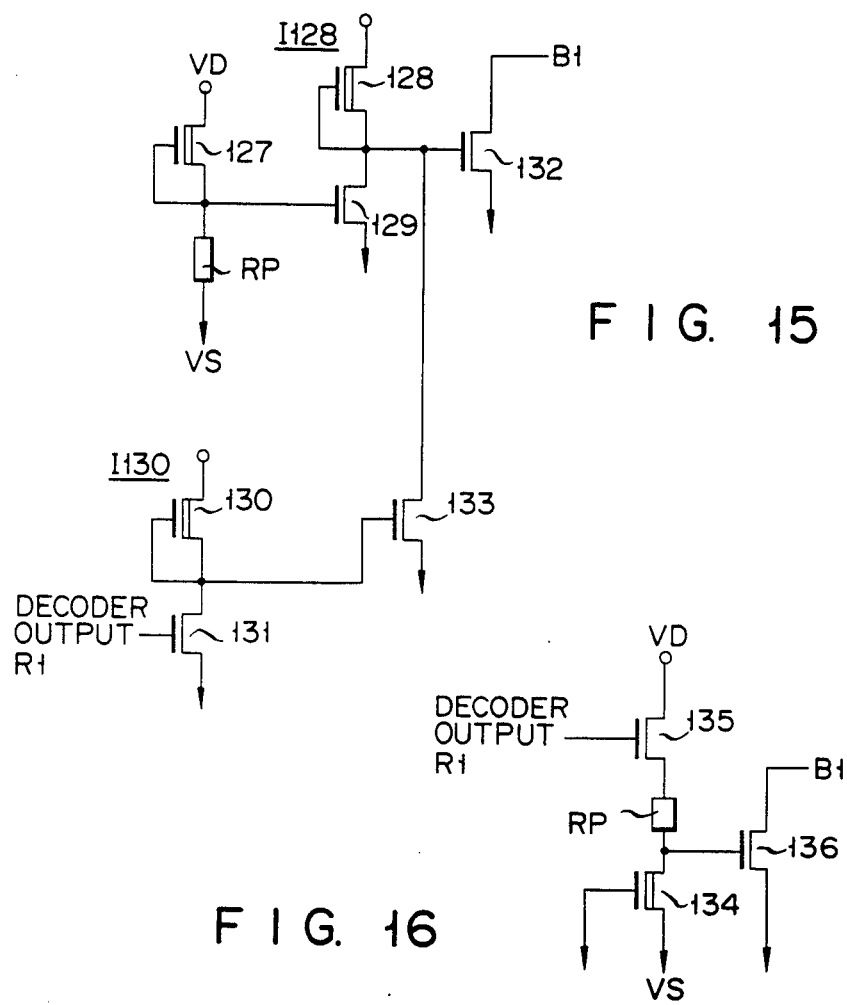
FIG. 15
FIG. 16

SEMICONDUCTOR MEMORY DEVICE

BACKGROUND OF THE INVENTION

The present invention relates to semiconductor memory devices with improved production yields.

With the increase of memory capacity in the fabrication of recent semiconductor memory devices, the probability of occurrence of error bit cells has also increased. Conventionally, semiconductor memory devices containing error bit cells have been discarded as defective devices. The discarding of the defective devices is very uneconomical, and also leads to an increase in the manufacturing cost. Some measures taken to solve this problem have succeeded in overcoming such uneconomical manufacturing methods. One of the successful measures employs a memory device with a redundancy function. Specifically, an auxiliary memory is used in addition to a main memory. When the main memory contains an error bit cell, a drive or select line, on which bit cells including the error bit are arranged, is selected and all of the bit cells including the error bit cell are replaced with the correct bit cells arrayed on a select line of the auxiliary memory.

FIG. 1 shows in block form an example of such a semiconductor memory device. In FIG. 1, reference numeral 1 designates an address buffer whose output is applied to a main address decoder 2 and an auxiliary decoder 3. The output signal from the main address decoder 2 is applied to a main memory 4 to select one of the row lines in the main memory 4. Subsequently, data may be written, by a write signal, into specified memory bit cells connected to the selected row line. Similarly, the data may be read out therefrom by a read signal. The main address decoder 2 is controlled by an output signal from the auxiliary address decoder 3. The decoder output of the auxiliary address decoder 3 is applied to an auxiliary memory 5. The signal selects one row line of the auxiliary memory 5. Then, data may be written into memory cells connected to the row line by a write signal, and read out therefrom by a read signal. The auxiliary address decoder 3 is programmed so as to produce an output signal representing an address of a memory area containing an error bit cell in the main memory.

A control signal generating circuit 6 generates a control signal for the auxiliary memory 5 when an error bit cell is found in the main memory 4. The control signal controls the auxiliary address decoder 3 so as to replace a specific number of bit cells including the error bit cell with the corresponding number of correct bit cells in the auxiliary memory 5. The specific number of bit cells are those arrayed on a select or drive line, having the error bit cell connected thereto, of the main or auxiliary memory. This circuit 6 is composed of a nonvolatile memory, so programmed that it drives the auxiliary address decoder 3 to access the auxiliary memory 5 when the error bit cell is found.

When the main memory 4 does not contain an error bit cell, this control circuit 6 does not operate, and the main address decoder 2 accesses the main memory 4.

On the other hand, when the main memory 4 has an error bit cell and is accessed, the control signal generating circuit 6 drives the auxiliary address decoder 3 to access the auxiliary memory 5, and at the same time to stop the operation of the main address decoder 2. In this way, the error bit cell in the main memory 4 is replaced with the correct bit cell of the auxiliary memory 5.

FIGS. 2A and 2B show practical circuit diagrams of two examples of the control signal generator 6. In the circuit shown in FIG. 2A, a fuse element F made of polysilicon or the like is inserted between a potential source VD and an output terminal Out. An enhancement type MOS transistor 7 is connected between the output terminal Out and a ground. A depletion type MOS transistor 8 is inserted between the output terminal Out and a ground. A programming signal P is applied to the gate of the MOS transistor 7. The gate of the MOS transistor 8 is connected to a ground. In the circuit shown in FIG. 2B, the potential source VD and the output terminal Out have a programming enhancement type MOS transistor 7 and a depletion type MOS transistor 8, which are connected in parallel therebetween. A fuse element F is inserted between the output terminal Out and a ground. A programming signal P is applied to the gate of the MOS transistor 7 and the gate of the MOS transistor 8 is connected to the output terminal Out.

In the circuit shown in FIG. 2A, when the fuse element F is not burned out, a signal level at the output terminal Out is logical "1" since the resistance ratio of the MOS transistor 8 and the fuse element F is very large. However, when it is burned out, the output terminal Out is grounded through the MOS transistor 8 and becomes logical "0". In order to burn out the fuse element F, a programming signal P of logical "1" is applied to the gate of the MOS transistor 7. Then, the MOS transistor 7 turns on to allow a large current to flow into the fuse element F. The large current generates Joule heat which in turn burns out the fuse element F. When the fuse element F is burned out, the signal P returns to logical "0" to turn off the transistor 7. The signal at the output terminal Out, or the control signal from the control signal generator 6, is logical "1", for example, and at this time the decoding operation of the auxiliary address decoder 3 stops. The decoding operation is performed only when the signal at the output terminal Out is logical "0".

In the circuit of FIG. 2B, when the fuse element F is not burned out, the signal level at the output terminal Out is kept at logical "0", unlike the circuit of FIG. 2A, since the resistance ratio of the MOS transistor 8 and the fuse element F is very large. On the other hand, when it is burned out, the output terminal Out is connected to the power source VD terminal through the MOS transistor 8, and is logical "1". In order to burn the fuse element F, a programming signal P of logical "1" is applied to the gate of the MOS transistor 7. At this time, the transistor 7 is turned on, as in the above case, to allow a large current to flow into the fuse element F. In this circuit, when the signal at the output terminal Out, or a control signal, is logical "0", the decoding operation of the auxiliary address decoder 3 is stopped. When it is logical "1", the decoding operation is executed.

FIG. 3 shows a circuit diagram of an example of the auxiliary address decoder 3 when the control signal generator 6 is not used. The auxiliary address decoder 3 is comprised of a depletion type MOS transistor 9 for a load, a plurality of enhancement type MOS transistors 10 for driving the auxiliary memory whose gates are coupled with an address signal or data $A_0$, $\overline{A_0}$, ..., $A_n$, $\overline{A_n}$, and a plurality of fuse elements $F_B$ inserted between each of the transistors 10 and the transistor 9.

The auxiliary address decoder 3 is so programmed that when the memory cell in the main memory 4 which is specified by an address signal $A_0 = A_1 = \ldots = A_n = 0$, is an error bit cell, the decoder 3 produces a signal designating this address. This programming is done by burning the fuse elements $F_B$ connected to the transistors 10 coupled with the address signals $\overline{A_0}$ to $\overline{A_n}$. The auxiliary address decoder 3 thus programmed responds to the address signal $A_0 = A_1 = \ldots = A_n = 0$ to access the auxiliary memory 5.

In the auxiliary address decoder 3 shown in FIG. 3, in order to access the auxiliary memory 5, a plurality of fuse elements $F_B$ must be burned out, which are selected according to the code of the address signal applied thereto. A laser beam or Joule heat is used to burn out these fuse elements. This burning means has some problems, however: welded material attached to its peripheral circuit reduces the reliability of the memory device, the failure of burning causes erroneous programming, and reliability on the burned locations is poor. In this respect, it is evident that the fewer the burning locations of the fuse elements, the better. With the remarkable progress of recent microelectronics technology, memory capacity has increased together with the number of bits of an address input signal. Accordingly, the number of fuse elements burned out in the auxiliary memory also increases. For this reason, there is a pressing need to solve the above problems.

SUMMARY OF THE INVENTION

This invention has been created in light of the above, and its object is to provide a semiconductor memory device which permits switching of the main memory over to the auxiliary memory if the main memory has an error bit cell by a simple operation, and thus permits improvement of the yield.

According to the invention, there is provided a semiconductor memory device comprising:
a main memory;
a decoder for selecting said main memory;
an auxiliary memory;
selecting means connected between said auxiliary memory and said decoder for selecting said auxiliary memory according to the output of said decoder; and
control means for controlling said selecting means.

According to the invention, there is further provided a semiconductor memory device comprising:
a column decoder;
a row decoder;
a main memory capable of being selected by said column and row decoders;
an auxiliary memory; and
circuit means operable according to the outputs of said column and row decoders to select said auxiliary memory when said main memory has an error bit cell.

BRIEF DESCRIPTION OF THE DRAWINGS

FIG. 10 is a circuit diagram showing a buffer circuit in the embodiment of FIG. 4;

FIG. 12 is a circuit diagram showing a modification of a control circuit in the embodiment of FIG. 4;

FIG. 13 is a circuit diagram showing an inverter in the embodiment of FIG. 11;

FIG. 14 is a circuit diagram showing a buffer circuit in the embodiment of FIG. 11;

FIG. 15 is a circuit diagram showing a circuit arrangement including the control circuit in the embodiment of FIG. 11;

FIG. 16 is a circuit diagram showing a modification of the circuit arrangement of FIG. 15;

DETAILED DESCRIPTION OF THE PREFERRED EMBODIMENTS

Figure 1:
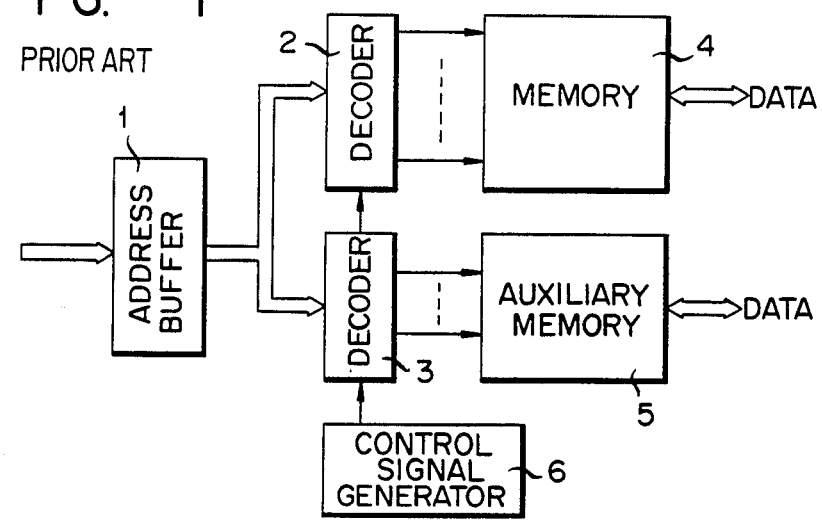
FIG. 1 is a block diagram showing a prior art semiconductor memory device having an auxiliary memory.
Figure 2A:
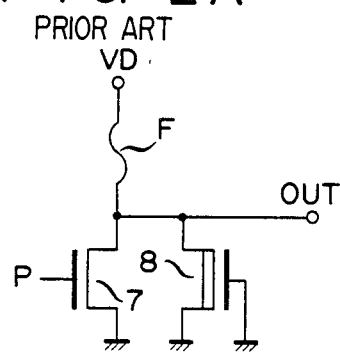
FIGS. 2A and 2B are circuit diagrams showing respective arrangements of a control signal generator incorporated in the semiconductor memory device shown in FIG. 1.
Figure 2B:
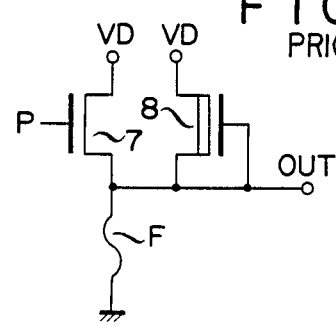
Figure 3:
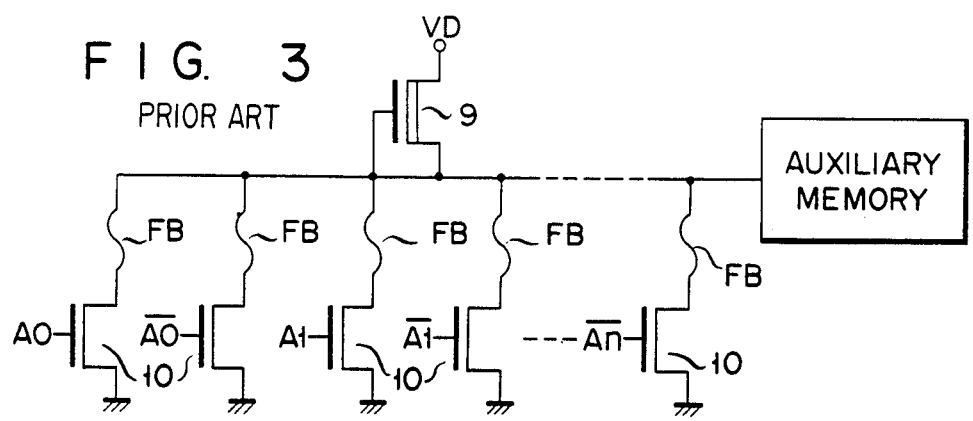
FIG. 3 is a circuit diagram showing a decoder circuit for an auxiliary memory in the prior art.
Figure 4:
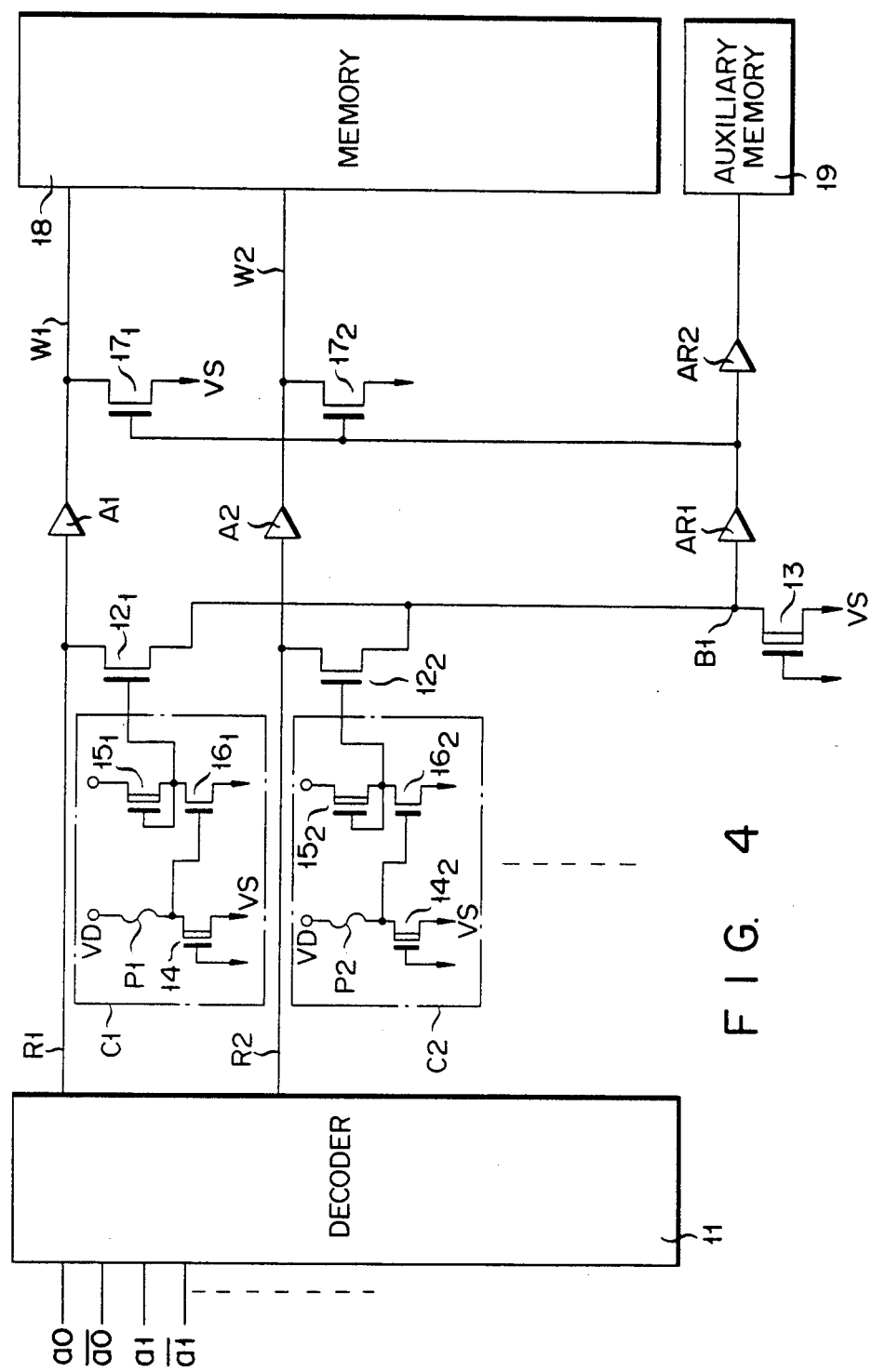
FIG. 4 is a schematic representation of one embodiment of the semiconductor memory device according to the invention.

FIG. 4 shows an embodiment of the semiconductor memory device according to the invention. Referring to the Figure, reference numeral 11 designates a decoder which decodes an address input signal $a_0$, $\overline{a_0}$, $a_1$, $\overline{a_1}$, ... to select one of the output lines $R_1$, $R_2$, ... The output lines $R_1$, $R_2$, ... are connected to the input terminal of respective buffer circuits $A_1$, $A_2$, ... The output terminal of the buffer circuits $A_1$, $A_2$, ... is connected to a main memory 18 through respective drive lines $W_1$, $W_2$, ... thereof. The output lines $R_1, R_2, \ldots$ are also connected through respective enhancement type transistors $12_1, 12_2, \ldots$ to the input terminal of a further buffer circuit $A_{R1}$ and the drain of a depletion type MOS transistor 13. The source and gate of the transistor 13 are connected to a reference potential source VS (e.g., ground). The output terminal of the buffer circuit $A_{R1}$ is connected through a buffer circuit $A_{R2}$ to an auxiliary memory 19. Control circuits $C_1, C_2, \ldots$ on-off control the respective transistors $12_1, 12_2, \ldots$. The control circuit $C_1$ includes depletion type MOS transistors $14_1$ and $15_1$, an enhancement type MOS transistor $16_1$ and a fuse element $P_1$, consisting of polysilicon, for example. The transistors $15_1$ and $16_1$ form an inverter. The drain-source path of the depletion type MOS transistor $14_1$ is connected at one terminal through the fuse element $P_1$ to a potential source VD and at the other terminal to the reference potential source VS. Its gate is also connected to the reference potential source VS. The inverter consisting of the transistors $15_1$ and $16_1$ is connected between the potential source VD and reference potential source VS. Its input terminal, i.e., the gate of the transistor $16_1$, is connected to the junction between the fuse element $P_1$ and transistor $14_1$. Its output terminal, i.e., the junction between the transistors $15_1$ and $16_1$, is connected to the gate of the transistor $12_1$. The control circuit $C_2$ and also the other control circuits (not shown) that are connected to their respective output lines have the same construction as the control circuit $C_1$. The following description concerning the control circuit applies to each control circuit, but only the control circuit $C_1$ will be described for the sake of simplicity. For the control circuit $C_2$, the parts corresponding to those in the control circuit $C_1$ are designated by like reference numerals and symbols with a different suffix. The drive lines $W_1, W_2, \ldots$ are connected through respective transistors $17_1, 17_2, \ldots$ to the reference potential source VS. The gate of the transistors $17_1, 17_2, \ldots$ is connected to the output terminal of the buffer circuit $A_{R1}$.

The operation of the control circuit $C_1$ will now be described. The control circuit $C_1$ has two different output levels depending upon whether the fuse element $P_1$ remains intact or is burned out. The transistor $12_1$ is controlled according to the state of the fuse element $P_1$. It is now assumed that the fuse element $P_1$ connected between the potential source VD and transistor $14_1$ remains intact. In this case, the junction between the fuse element $P_1$ and transistor $14_1$ is at the "1" level. Thus, the transistor $16_1$ is "on", so that the inverter consisting of the transistors $15_1$ and $16_1$, i.e., the control circuit $C_1$, provides a "0" level output to hold the transistor $12_1$ "off".

When the fuse element $P_1$ is burned out, for instance by irradiation thereof with a laser beam, the gate level of the transistor $16_1$ becomes "0" to turn off the transistor $16_1$. Thus, the inverter, i.e., the control circuit $C_1$, provides a "1" level output to turn on the transistor $12_1$. As is shown, the output of the control circuit $C_1$ is at either one of the two levels depending upon whether the fuse element $P_1$ connected between the potential source VD and transistor $14_1$ remains intact or it is burned out, and the transistor $12_1$ is on-off controlled according to the state of the fuse element $P_1$.

The operation of the memory device shown in FIG. 14 will now be described.

If the main memory 18 is free from any error bit cell, the fuse elements $P_1, P_2, \ldots$ in the respective control circuits $C_1, C_2, \ldots$ connected between the potential source VD and the respective transistors $14_1, 14_2, \ldots$ are not burned out but remain intact. The transistors $12_1, 12_2, \ldots$ are thus "off", so that the outputs of the decoder are applied through the respective buffer circuits $A_1, A_2, \ldots$ to the main memory 18. The main memory 18 is thus selected and rendered operative. In this case, since the transistors $12_1, 12_2, \ldots$ are "off", the junction $B_1$ between each of the transistors $12_1, 12_2, \ldots$ and transistor 13 is held at the reference potential VS (i.e., at the "0" level) through the transistor 13. The output level of the buffer circuits $A_{R1}$ and $A_{R2}$ is thus "0" (i.e., level VS), and the auxiliary memory 19, which is not selected, remains inoperative. Now, a case will be considered in which there is an error bit cell connected to the drive line $W_1$ of the main memory 18. In this case, the fuse element $P_1$ in the circuit $C_1$ is burned out, for instance by irradiating it with a laser beam. In this state, the gate of the transistor $16_1$ is held at the "0" level through the transistor $14_1$, thus keeping the transistor $16_1$ "off". The gate of the transistor $12_1$ is thus held at the source potential level VD (e.g., 5 volts) through the transistor $15_1$, thus keeping the transistor $12_1$ "on". The decoder output line $R_1$ is thus connected to the point $B_1$. When a decoder output of "1" appears, the point $B_1$ is also set to the "1" level by the transistor $12_1$. The buffer circuits $A_{R1}$ and $A_{R2}$ thus both provide a "1" level output. The auxiliary memory 19 is thus selected and rendered operative. The resistance of the transistor is set to a sufficiently high value to allow the point $B_1$ to go to the "1" level. As soon as the auxiliary memory 19 is selected, the transistors $17_1, 17_2, \ldots$ are turned on by the "1" level output of the buffer circuit $A_{R1}$, and thus, the main memory 18 is not selected.

As has been shown, in the above embodiment of FIG. 4, the auxiliary memory 19 can be substituted for the main memory 18 by burning out a single fuse element such as the fuse element $P_1$ in the control circuit $C_1$, for instance by irradiating the same with a laser beam.

While the above embodiment of FIG. 4 has a single auxiliary memory, similar effects of the invention can also be obtained in cases where there are two auxiliary memories. In this case, the transistors $12_1, 12_2, \ldots$, transistor 13, circuits $C_1, C_2, \ldots$, buffer circuits $A_{R1}$ and $A_{R2}$ and transistors $17_1, 17_2, \ldots$ may be provided in duplicate.

Figure 5:
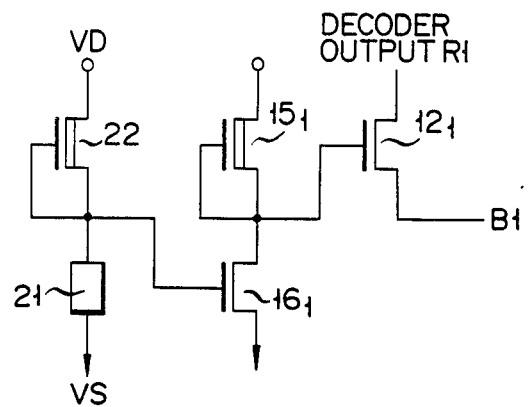
FIG. 5 is a circuit diagram showing a modification of a control circuit used in the embodiment of FIG. 4.

FIG. 5 shows a different example of the control circuit $C_1$. While in the circuit $C_1$ shown in FIG. 4 the fuse element $P_1$ is adapted to be burned out with, for example, a laser beam, in the circuit of FIG. 5 a high resistance polysilicon element 21 is laser annealed, i.e., rendered in the low resistance state by irradiation with a laser beam, thereby causing a change of the output level of the circuit to "1".

The high resistance polysilicon element 21 has one terminal connected through a depletion type MOS transistor 22 to the potential source VD, and the other terminal connected to the reference potential source VS. The gate of the transistor 22 is connected to the junction between the transistor 22 and high resistance polysilicon element 21. The gate of the transistor 22 is also connected to the gate of the transistor $16_1$. The circuit further includes an inverter, which consists of a depletion type MOS transistor $15_1$ and an enhancement type MOS transistor $16_1$ and is connected between the potential source VD and reference potential source VS. The output terminal of the inverter, i.e., the junction between the MOS transistor $15_1$ and $16_1$, is connected to the gate of the transistor $12_1$.

With this construction, the high resistance polysilicon element 21 remains intact unless the memory bit cells connected to the drive line $W_1$ of the main memory 18 include an error bit cell. In this case, the junction between the transistor 22 and the high resistance polysilicon element 21 is held at the "1" level. Thus, the transistor $16_1$ is "on" to hold the gate of the transistor $12_1$ at the "0" level, and hence, hold the transistor $12_1$ "on". The decoder output line $R_1$ is thus held apart from the point $B_1$. If the memory bit cells connected to the drive line $W_1$ include an error bit cell, the high resistance polysilicon 21 is changed to the low resistance state by laser annealing, for instance. In this state, the gate of the transistor $16_1$ is held at the "0" level to hold the transistor $16_1$ "off". The gate potential on the transistor $12_1$ is thus held at the "1" level through the transistor $15_1$, so that the transistor $12_1$ is "off". The auxiliary memory 19 is thus selected in this case in the manner as described before in connection with FIG. 4.

Figure 6:
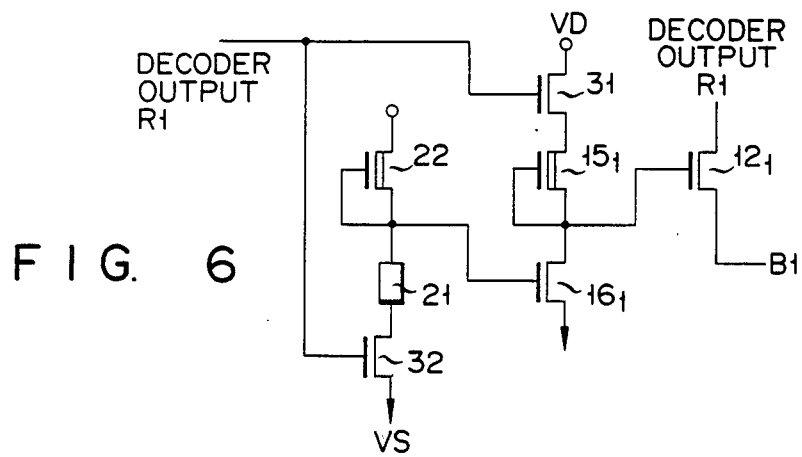
FIG. 6 is a circuit diagram showing a modification of the control circuit of FIG. 5 having an additional function of reducing power consumption.

FIG. 6 shows a modification of the circuit of FIG. 5 for reducing power consumption. In this circuit, the decoder output on the output line $R_1$ is fed to the gate of transistors 31 and 32 so that the circuit is only operated when the decoder output level becomes "1". More specifically, in the circuit of FIG. 6 the transistor 31 is connected between the potential source VD and transistor $15_1$ while the transistor 32 is connected between the high resistance polysilicon element 21 and reference potential source VS. These transistors have their gates connected to the output line $R_1$. This circuit is only rendered operative when the transistors 31 and 32 are turned on with a change of the decoder output appearing on the output line $R_1$ to the "1" level. When the decoder output is "0", the transistors 31 and 32 are "off" so that the circuit is inoperative. In other words, unless the output line $R_1$ is selected, no current flows through the circuit. Thus, power consumption can be reduced.

Figure 7:
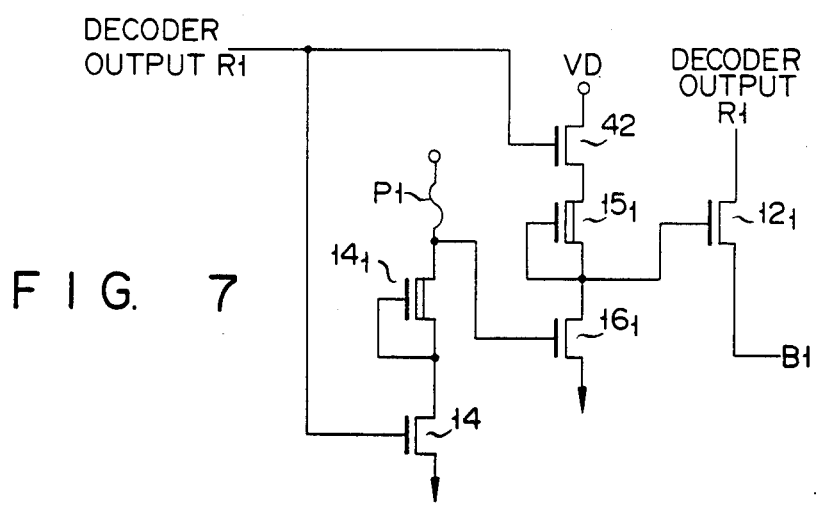
FIG. 7 is a circuit diagram showing a further modification of the control circuit in the embodiment of FIG. 4 having an additional function of reducing power consumption.

FIG. 7 shows a further modification of the control circuit $C_1$ in the memory device of FIG. 4. This circuit, like the circuit of FIG. 6, includes two additional MOS transistors 41 and 42. The decoder output is applied to the gates of these transistors 41 and 42, and thereby the power consumption in the control circuit $C_1$ can be reduced. To be more specific, the additional MOS transistor 41 is connected between the transistor $14_1$ and reference potential source VS, while the additional MOS transistor 42 is connected between the transistor $15_1$ and potential source VD, with the gates of these MOS transistors 41 and 42 being connected to the output line $R_1$ of the decoder 11. With this construction, the circuit is rendered operative only when the transistors 41 and 42 are turned on with a change of the output of the decoder 11 to the "1" level and is inoperative otherwise, i.e., when the decoder output is "0". In other words, unless the output line $R_1$ is selected, no current flows through the circuit, so that power consumption can be reduced.

Figure 8:
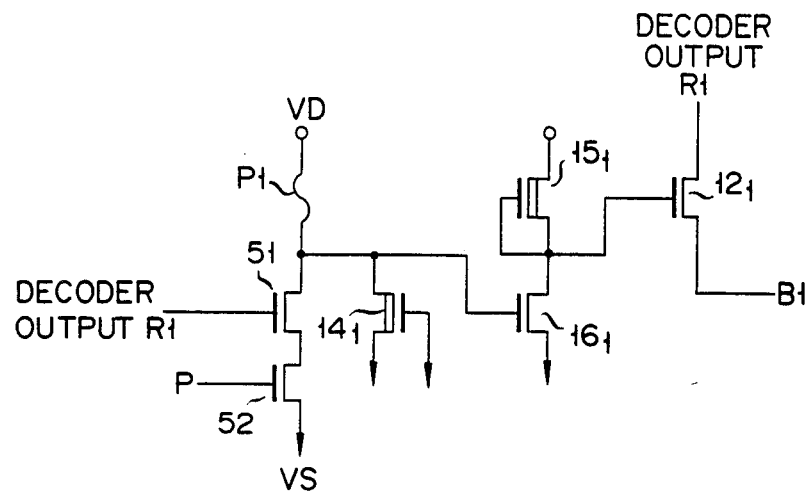
FIG. 8 is a circuit diagram showing a circuit arrangement, which includes the control circuit of the embodiment of FIG. 4 and a circuit for burning out a fuse element.

FIG. 8 shows a further modification of the control circuit $C_1$ shown in FIG. 4. In this instance, a polysilicon fuse element $P_1$ is adapted to be burned out by Joule heat from a generated current. This circuit has an advantage over the circuit shown in FIG. 4, in which the fuse element $P_1$ is burned out by irradiation with a laser beam, in that a semiconductor memory device which uses this circuit can be sealed in a casing. This circuit uses two MOS transistors 51 and 52 in addition to the control circuit $C_1$ in the memory device of FIG. 4. These MOS transistors are connected in series between the polysilicon fuse element $P_1$ and reference potential source VS. The gate of the transistor 51 is connected to the output line $R_1$ of the decoder 11. A signal P for controlling the MOS transistor 52 is applied to the gate thereof. To burn out the polysilicon fuse element $P_1$ in the above construction, the address input signal to the decoder 11 is set to that locus which represents the address of the error bit cell. As a result, a "1" output is provided from the decoder to the output line $R_1$ to turn on the transistor 51. Subsequently, the signal P is set to "1" to turn on the transistor 52. Current is thus caused to flow through the fuse element $P_1$ and transistors 51 and 52. The fuse element $P_1$ is then burned out by Joule heat generated at this time.

Figure 9:
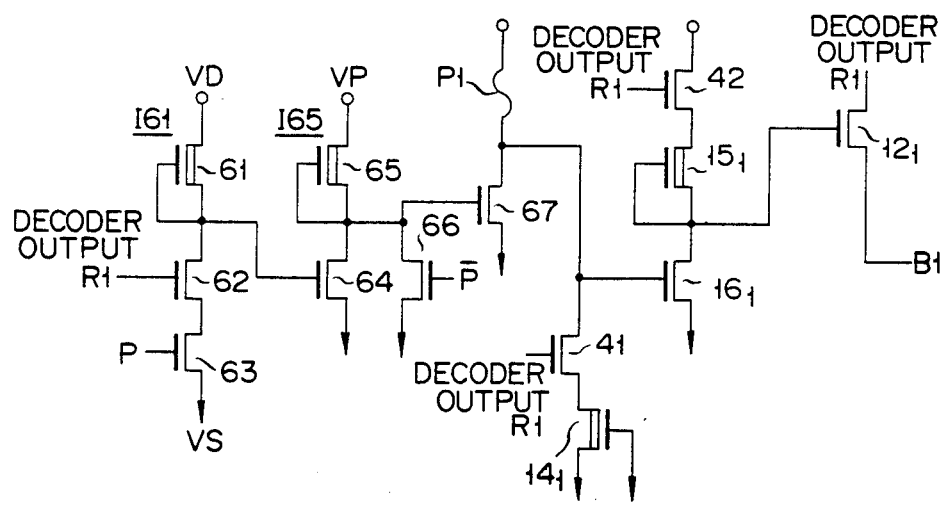
FIG. 9 is a circuit diagram showing a circuit arrangement, which includes the control circuit of the embodiment of FIG. 4 and has the functions of burning out a fuse element and reducing power consumption.

FIG. 9 shows a still further modification of the control circuit $C_1$, the fuse element $P_1$ of which is again adapted to be burned out by a generated current. In this instance, MOS transistors 61 to 67 are provided in addition to the circuit of FIG. 7. Further, like the circuit of FIG. 7 transistors 41 and 42 are provided for reducing power consumption. The transistor 41 in this circuit, unlike the circuit of FIG. 7, is provided between the fuse element $P_1$ and transistor $14_1$. This, however, is a mere structural change, and there is no change in operation at all.

The portion of the circuit that can serve to burn out the fuse will now be described in detail. The MOS transistor 61, which is a depletion type, and the MOS transistor 62, which is an enhancement type, form an inverter $I_{61}$ connected between the potential source VD and reference potential source VS. The MOS transistor 63 is connected between the transistor 62 and reference potential source VD. The input terminal of the inverter $I_{61}$ consisting of the transistors 61 and 62, i.e., the gate of the transistor 62, is connected to the output line $R_1$ of the decoder 11. A control signal P for on-off controlling the transistor 63 is applied to the gate thereof. The MOS transistor 65, which is a depletion type, and MOS transistor 64, which is an enhancement type, form another inverter $I_{65}$ connected between a high potential source VP and reference potential source VS. The output terminal of the preceding stage inverter $I_{61}$ consisting of the transistors 61 and 62, i.e., the junction between the transistors 61 and 62, is connected to the input terminal of the inverter $I_{65}$, i.e., the gate of the transistor 64. The MOS transistor 66 is connected between the input terminal of the inverter $I_{65}$ consisting of the transistors 64 and 65, i.e., the junction between the transistors 64 and 65, and the reference potential source VS. A complementary control signal $\overline{P}$ to the control signal P applied to the gate of the transistor 63 is applied to the gate of the transistor 66. The MOS transistor 67 is connected between the junction between the transistor 41 and fuse element $P_1$ and the reference potential source VS. The gate of the transistor 67 is connected to the input terminal of the second stage inverter $I_{65}$, i.e., the junction between the transistors 64 and 65. The level of the high potential source VP may be set to approximately 15 volts. The use of such a high potential source allows a large current to burn out the fuse element $P_1$ even if the size of the transistor, through which the burn-out current flows, is small. Thus, it permits increasing the packing density of the device.

To burn out the fuse $P_1$, the address input signal to the decoder 11 is set to select the output line $R_1$ like the example of FIG. 8. When the output line $R_1$ is selected by a "1" input, the transistor 62 is turned on. In this state, the signal P is set to "1" to turn on the transistor 63. The potential on the gate of the transistor 64 is thus changed to the "0" level to turn off the transistor 64. At this time, the transistor 66 remains "off" since the signal $\bar{P}$ is "0". The gate of the transistor 67 is thus raised to the high potential VP to turn on the transistor 67. Current is thus caused to flow through the transistor 67 into the fuse element $P_1$, whereby the fuse element $P_1$ is burned out by Joule heat. The resistance of the transistor 67 at this point is very low since its gate is at the high potential VP. Thus, a large current can reliably burn out the fuse element $P_1$ even if the transistor 67 is small.

The high potential source VP is used only when burning out the fuse, and after the burn-out operation the gate of the transistor 67 is brought to the "0" level to turn off the transistor 67. With the fuse element $P_1$ burned out, the gate of the transistor $16_1$ is now at the reference potential to hold the transistor $16_1$ "off". In this state, when the output line $R_1$ of the decoder 11 is selected, the output of the inverter consisting of the transistors $15_1$ and $16_1$ goes to the "1" level to turn on the transistor $12_1$. The auxiliary memory 19 is thus substituted for the main memory 18.

FIG. 10 shows an example of the buffer circuit $A_1$ provided between the output line $R_1$ and drive line $W_1$ in the memory device of FIG. 4. The circuit has MOS transistors 71 to 78. The transistors 71 and 72, which are depletion type and enhancement type, respectively, are connected in series between the potential source VD and reference potential source VS to form an inverter $I_{71}$. The input terminal of the inverter $I_{71}$, i.e., the gate of the transistor 72, is connected to the junction $B_1$ between the transistors $12_1$ and 13 in the memory device of FIG. 4. The transistor 73, which is a depletion type, and transistors 74 and 75, which are enhancement type, are connected in series in the mentioned order between the potential source VD and reference potential source VS. The transistors 73 and 74 form an inverter $I_{73}$. The transistors 76 to 78 are connected in series in the mentioned order between the potential source VD and reference potential source VS. The output terminal of the inverter consisting of the transistors 71 and 72, i.e., the junction between the transistors 71 and 72, is connected to the gate of each of the transistors 75 and 76. The gates of the transistors 74 and 77 are connected to the output line $R_1$ of the decoder 11. The output terminal of the inverter $I_{73}$ consisting of the transistors 73 and 74, i.e., the junction between the transistors 73 and 74, is connected to the gate of the transistor 78. The junction between the transistors 77 and 78 is connected to the drive line $W_1$ connected to the main memory 18.

The operation of the buffer circuit having the above construction will now be described. If the main memory 18 has no error bit cell, the junction $B_1$ is at the "0" level. In this state, the inverter $I_{71}$ consisting of the transistors 71 and 72 provides a "1" output, that is, a "1" input is applied to the gate of each of the transistors 75 and 76 to hold these transistors 75 and 76 "on". The buffer circuit thus provides a signal at a level corresponding to the level of the output line $R_1$ to the drive line $W_1$. If the level of the output line $R_1$ becomes "1", the transistors 74 and 73 are turned on. With the transistor 74 turned on, the output of the inverter $I_{73}$ consisting of the transistors 73 and 74 becomes "0" to turn off the transistor 78. A "1" level signal is thus provided from the junction between the transistors 77 and 78. If the level of the output line $R_1$ becomes "0", the transistors 74 and 77 are both turned off. With the transistor 74 turned off, the output of the inverter $I_{73}$ consisting of the transistors 73 and 74 becomes "1" to turn on the transistor 78. A "0" level signal is thus provided from the junction between the transistors 77 and 78.

If the main memory 18 has an error bit cell connected to the drive line $W_1$ so that the auxiliary memory 19 is selected, the level at the junction $B_1$ is "1". In this state, the inverter $I_{71}$ consisting of the transistors 71 and 72 provides a "0" level output. That is, a "0" level input is applied to the gate of each of the transistors 75 and 76 to keep the transistors 75 and 76 "off". In this condition, the buffer circuit $A_1$ thus provides a "0" level output irrespective of the level of the output line $R_1$. More particularly, with the transistors 75 and 76 turned off, the buffer circuit $A_1$ provides a "0" level signal at all times and is not influenced by whether the level of the output line $R_1$ is "0" or "1".

Where the buffer circuit $A_1$ of FIG. 10 described above is used, the transistor $17_1$ in the memory device of FIG. 4 is unnecessary.

It is to be appreciated that in the embodiment of FIGS. 4 through 10 described above a transistor circuit for selecting the auxiliary memory is provided between the decoder and auxiliary memory and on-off controlled depending upon whether a single fuse element assembled in the control circuit is burned out or not or whether a high resistance polysilicon element assembled in the control circuit is rendered in a low resistance state or not. Thus, the operation of selecting the auxiliary memory can be readily accomplished with high reliability.

Figure 11:
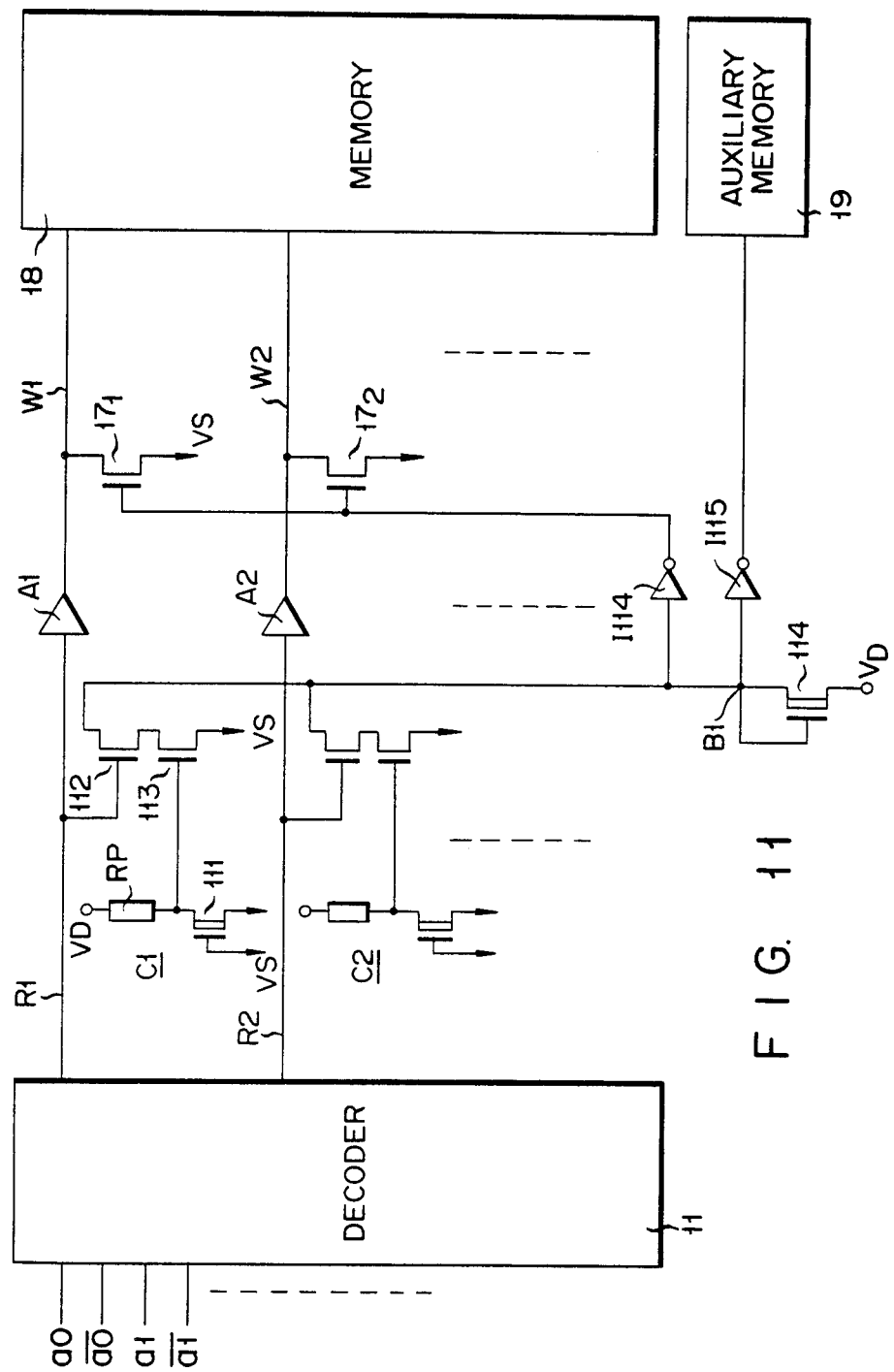
FIG. 11 is a schematic representation of a different embodiment of the semiconductor device according to the invention.

FIG. 11 shows a different embodiment of the memory device according to the invention. In this embodiment, like parts to those in the preceding embodiment of FIG. 4 are designated by like reference numerals and symbols. In this embodiment, control circuit $C_1$ includes a high resistance polysilicon element $R_{P1}$ and a MOS transistor $111_1$ having one terminal connected through the high resistance polysilicon element $R_{P1}$ to a potential source VD and the other terminal connected to a reference potential terminal VS. Further, two MOS transistors 112 and 113 connected in series between the reference potential source VS and junction $B_1$ are used in lieu of the MOS transistor $12_1$ in the embodiment of FIG. 4. Since the MOS transistors 112 and 113 connected to the reference potential source VS are used instead of the MOS transistor $12_1$ noted above, this embodiment does not include the buffer circuits $A_{R1}$ and $A_{R2}$ as in the embodiment of FIG. 4. Instead, it uses an inverter $I_{114}$, which has its input terminal connected to the junction $B_1$ and its output terminal connected to the gates of transistors $17_1, 17_2, \ldots$, and another inverter $I_{115}$, which has its input terminal connected to the junction $B_1$ and its output terminal connected to auxiliary memory 19.

In the control circuit $C_1$, the junction between the high resistance polysilicon element $R_{P1}$ and transistor $111_1$ is held at a "0" level so long as the high resistance polysilicon element $R_{P1}$ remains as such, i.e., is in a high resistance state. In this case, the gate potential on the transistor 113 is at the "0" level so that the transistor 113 is "off". On the other hand, when the high resistance element $R_{P1}$ is changed to a low resistance state by means of laser annealing, the junction is at the "1" level. In this case, the gate potential on the transistor 113 is at the "1" level so that the transistor 113 is "on".

It is now assumed that the memory bit cells connected to the drive line $W_1$ do not include any error bit cell. In this case, the high resistance polysilicon element $R_{P1}$ is held as such, i.e., in the high resistance state. In this case the control circuit $C_1$ provides a "0" level output so that the transistor 113 is "off". The junction $B_1$ is thus held at the source potential VD through the transistor 114, that is, it is held at the "1" level. The output level of the inverter $I_{115}$ connected to the auxiliary memory 19 is thus "0", so that the auxiliary memory 19 is not selected.

When the memory bit cells connected to the drive line $W_1$ include an error bit cell, the high resistance polysilicon element $R_{P1}$ is changed to the low resistance state by means of laser annealing. Thus, the control circuit $C_1$ provides a "1" level output to hold the transistor 113 "on". In this state, when the output line $R_1$ of the decoder 11 becomes "1" level, the gate potential level on the transistor 112 becomes "1" to turn on the transistor 112. Now, the transistors 112 and 113 are both "on", so that the level on the junction $B_1$ becomes "0". The inverter $I_{115}$ thus provides a "1" level output to select the auxiliary memory 19. With the change of the level of the junction $B_1$ to "0", the output of the inverter $I_{114}$ is also changed to "1" to turn on the transistors $17_1$, $17_2$, ... The drive line $W_1$ is thus brought to the reference potential source level VS, thus the main memory 18 is not selected.

FIG. 12 shows a modification of the control circuit $C_1$ in the memory device of FIG. 11. In this instance, a polysilicon fuse element P is used in lieu of the high resistance polysilicon element $R_{P1}$ in FIG. 11. The polysilicon fuse element P is connected at one terminal through a depletion type MOS transistor 116 to the potential source VD and at the other terminal to the reference potential source VS. The junction between the polysilicon fuse element P and transistor 116 is connected to the gate of the transistor 113 in the memory device of FIG. 11. In this circuit, so long as the polysilicon fuse element P is held without being burned out, the output level remains "0". On the other hand, when the fuse element P is burned out, it becomes "1". The polysilicon fuse element P may be burned out by irradiating it with a laser beam, for instance.

FIG. 13 shows an example of the inverter $I_{115}$ in the memory device of FIG. 11. This circuit includes an inverter $I_{117}$, which consists of a depletion type MOS transistor 117 and an enhancement type MOS transistor 118, these transistors being connected in series between the potential source VD and a reference potential source VS, and two series MOS transistors 119 and 120 connected in the mentioned order between the potential source VD and reference potential source VS. The input terminal of the inverter $I_{117}$, i.e., the gate of the transistor 118, and the gate of the transistor 120 connected to the reference potential source VS are both connected to the junction $B_1$ in the memory device of FIG. 11. The gate of the transistor 119 connected to the potential source VD is connected to the output terminal of the inverter $I_{117}$, i.e., the junction between the transistors 117 and 118. The junction between the transistors 119 and 120 is connected to the auxiliary memory 19.

With the above construction, so long as the level of the junction $B_1$ is "1", the level of the gate potential on the transistors 118 and 120 is "1" so that these transistors 118 and 120 are "on". With the transistor 118 in the "on" state, the output level of the inverter $I_{117}$ is "0", that is, the gate level of the transistor 119 is "0" so that the transistor 119 is "0". With the transistors 119 and 120 respectively in the "off" and "on" state, the transistor 120 is "on". The output level of the circuit is thus "0" so that the auxiliary memory 19 is not selected.

When the level of the junction $B_1$ is changed to "0", the gate level on the transistors 118 and 120 is changed to "0" to turn off the transistors 118 and 120. With the transistor 118 turned off, the output level of the inverter $I_{117}$ becomes "1". The gate level on the transistor 119 thus becomes "1" to turn on the transistor 119. Now, with the transistors 119 and 120 respectively "on" and "off", the circuit output level is changed to "1" to select the auxiliary memory 19. This example of a circuit consisting of the transistors 119 and 120 has a buffer function in addition to the inverter function provided by the inverter $I_{117}$ consisting of the transistors 117 and 118.

FIG. 14 shows an example of the buffer circuit $A_1$ in the memory device of FIG. 11. This circuit reduces power consumption in addition to its buffer function. It includes an inverter $I_{121}$, which consists of a depletion type MOS transistor 121, and an enhancement type MOS transistor 122, these transistors being connected in series between the potential source VD and reference potential source VS. It also includes transistors 123 to 125 connected in series in the mentioned order between the potential source VD and reference potential source VS. It further includes a MOS transistor 126 having one terminal connected through the inverter $I_{121}$ to the potential source VD and the other terminal connected to the reference potential source VS. The gate of the transistor 122 in the inverter $I_{121}$ and the gate of the second transistor 124 in the series MOS transistor circuit are connected to the output line $R_1$. The gate of the third transistor 125 in the series MOS transistor circuit is connected to the output terminal of the inverter $I_{121}$, i.e., the junction between the transistors 121 and 122. The transistors 126 and 123 are provided for reducing power consumption, and their gate is connected to the junction $B_1$ in the memory device of FIG. 11.

With the above construction, when the auxiliary memory 19 is not selected, i.e., when the potential level on the junction $B_1$ in the memory device of FIG. 11 is "1", the gate potential level on the transistors 123 and 126 is "1" so that these transistors 123 and 126 are "on". In this state, the output signal of the buffer circuit $A_1$ is thus at a level corresponding to the input signal level. To be more specific, when the output line $R_1$ is selected so that its level becomes "1", the gate potential level on the transistor 122 in the inverter $I_{121}$ and the second transistor 124 in the series MOS transistor circuit becomes "1" to turn on the transistors 122 and 124. With the transistor 122 turned on, the level of the output signal of the inverter $I_{121}$ becomes "0" to turn off the third transistor 125 in the series MOS transistor circuit. Thus, the buffer circuit $A_1$ provides an output signal at the same level as the input signal level. When the output line $R_1$ is not selected, i.e., when the level thereof is changed to "0", the gate level of the transistors 122 and 124 becomes "0" to turn off these transistors. With the transistor 122 turned off, the output level of the inverter $I_{121}$ becomes "1" to turn on the transistor 125. The buffer circuit $A_1$ thus provides an output signal at the same level as the input signal level of "0". As has been shown, the output level of the buffer circuit $A_1$ corresponds to the input level while the transistors 123 and 126 are "on".

When the auxiliary memory 19 is in the selected state, i.e., when the potential level at the junction $B_1$ in the memory device of FIG. 11 is "0", the gate potential level on the transistors 123 and 126 is "0" so that these transistors 123 and 126 are "off". In this case, the output level of the buffer circuit $A_1$ is "0" irrespective of the input level. The inverter $I_{121}$ provides a "1" level output irrespective of the level of the output line $R_1$ so that the transistor 125 is held "on". Therefore, the junction between the transistors 124 and 125 is kept apart from the potential VD irrespective of the level of the output line $R_1$. The output level of the buffer circuit $A_1$ is thus held at "0" irrespective of the input level. It is to be appreciated that the buffer circuit $A_1$ described above functions to inhibit the selection of the level of the drive line of the main memory 18, while the transistors 123 and 126 function to reduce power consumption while the main memory 18 is in the non-selected state. Where this buffer circuit is used, the transistors $17_1, 17_2, \ldots$ in the memory device of FIG. 11 are unnecessary.

FIG. 15 shows a modification of the circuit consisting of the control circuit $C_1$ and transistors $112_1$ and $113_1$ in the memory device of FIG. 11. In this example, a high resistance polysilicon element $C_1$ and a depletion type MOS transistor 127 having one terminal connected to the potential source VD and the other terminal connected to the reference potential source VS are used in lieu of the control circuit $C_1$ in the memory device of FIG. 11. The circuit further includes an inverter $I_{128}$, which consists of a depletion type MOS transistor 128 and an enhancement type MOS transistor 124, these transistors being connected in series between the potential source VD and reference potential source VS, and another inverter $I_{120}$, which consists of a depletion type MOS transistor 130 and an enhancement type MOS transistor 131, these transistors being connected in series between the potential source VD and reference potential source VS. It further includes a MOS transistor 132, which has one terminal connected to the reference potential source VS, the other terminal connected to the junction $B_1$ shown in FIG. 11 and the gate connected to the output terminal of the inverter $I_{128}$, i.e., the junction between the transistors 128 and 129. It further includes a MOS transistor 132, which has one terminal connected to the reference potential source VS, the other terminal connected to the output terminal of the inverter $I_{128}$ and the gate connected to the output terminal of the inverter $I_{130}$, i.e., the junction between the transistors 130 and 131. The circuit consisting of the inverters $I_{128}$ and $I_{130}$ and MOS transistors 132 and 133 has the same function as the circuit consisting of the transistors 112 and 113 in the memory device of FIG. 11. The gate of the inverter $I_{128}$ is connected to the output terminal of the control circuit $C_1$. The gate of the transistor 131 of the inverter $I_{130}$ is connected to the output line $R_1$ of the decoder 11 of the memory device of FIG. 11.

With the above construction, if the memory bit cells connected to the drive line $W_1$ of the main memory 18 do not include any error bit cell, the high resistance polysilicon element $R_P$ in the control circuit $C_1$ is kept in this state. The gate potential on the transistor 129 is thus "1" so that this transistor is "on". The transistor 132 which is connected between the potential source VS and junction $B_1$ is thus "off". Therefore, when the output line $R_1$ of the decoder 11 is selected in this state, the main memory 18 is selected while the auxiliary memory 19 is not selected. If the memory bit cells connected to the drive line $W_1$ include an error bit cell, the high resistance polysilicon element $R_P$ is changed to the low resistance state by laser annealing. When the high resistance polysilicon element $R_P$ is rendered in the low resistance state, the gate potential level on the transistor 129 is changed to "0" so that the transistor 129 is turned off. In this state, when the output line $R_1$ is selected to the "1" level, the transistor 131 of the inverter $I_{130}$ is turned on. As a result, the output level of the inverter $I_{130}$ becomes "0" to turn off the transistor 133. The gate potential level on the transistor 132 thus becomes "1" so that this transistor is turned off. Thus, a "0" level output is provided from the junction $B_1$, so that the auxiliary memory 19 is not selected.

FIG. 16 shows a further modification of the circuit consisting of the control circuit $C_1$ and transistors $112_1$ and $113_1$ in the memory device of FIG. 11. In this example, a high resistance polysilicon element $R_P$ and a depletion type MOS transistor 134 having one terminal connected through the high resistance polysilicon element $R_P$ to the potential source VD and the other terminal connected to the reference potential source VS and used in lieu of the control circuit $C_1$ in the memory device of FIG. 11. The circuit further includes a MOS transistor 135 connected between the high resistance polysilicon element $R_P$ and potential source VD. The gate of the transistor 135 is connected to the output line $R_1$ of the decoder 11. The junction between the high resistance polysilicon element $R_P$ and transistor 134 is connected to the gate of the MOS transistor 136. The transistor 136 is connected at one terminal to the junction $B_1$ and at the other terminal to the reference potential source VS.

With the above construction, if the memory bit cells connected to the drive line $W_1$ of the main memory 18 do not include any error bit cell, the high resistance polysilicon element $R_P$ remains in the high resistance state. The gate potential level on the transistor 136 is thus "0" so that this transistor 136 is "off". When the output line $R_1$ of the decoder 11 is selected in this state, the drive line $W_1$, i.e., the main memory 18 is selected while the auxiliary memory 19 is not selected. If there is an error bit cell connected to the drive line $W_1$, the high resistance polysilicon element $R_P$ is thus rendered in the low resistance state by laser annealing. In this state, the transistor 136 operates depending upon the operation of the transistor 135. To be more specific, when the output line $R_1$ is selected so that the gate potential level on the transistor becomes "1", the transistor 135 is turned on. As a result, the gate potential level on the transistor 136 becomes "1" so that this transistor 136 is turned on. A "0" level output is thus provided from the junction $B_1$ to select the auxiliary memory 19.

Figure 17:
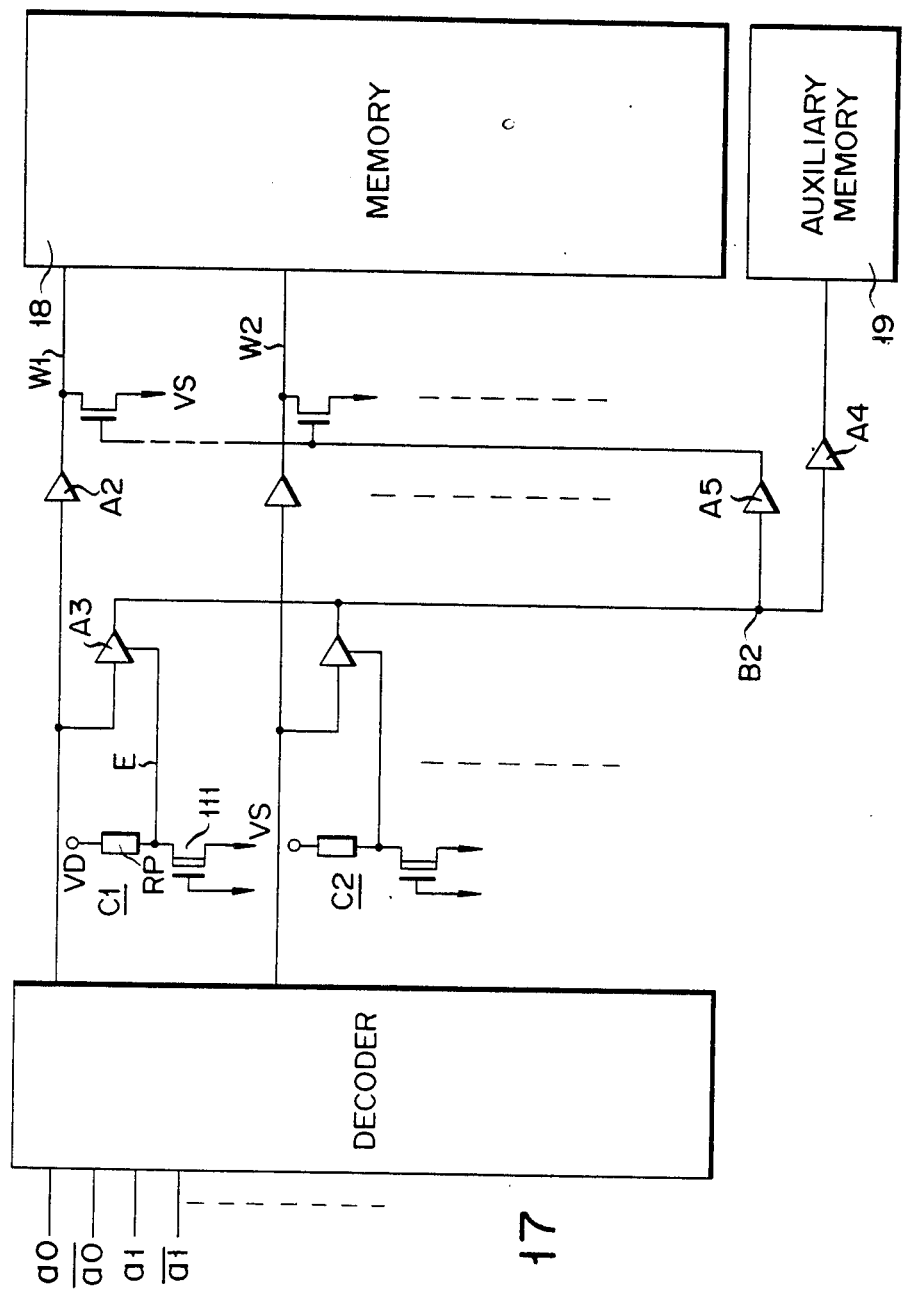
FIG. 17 is a schematic representation of a further embodiment of the semiconductor memory device according to the invention.

FIG. 17 shows a further embodiment of the memory device according to the invention. In this embodiment, like parts to those in the preceding embodiments of FIGS. 4 and 11 are designated by like reference numerals and symbols. In this embodiment, a buffer circuit $A_3$ is used in lieu of the circuit consisting of the transistors $112_1$ and $113_1$ in the preceding embodiment of FIG. 11, while the same circuit as the control circuit $C_1$ in the embodiment of FIG. 11 is used.

The buffer circuit $A_3$ has its input terminals connected to the output line $R_1$ of the decoder 11 and the output terminal of the control circuit $C_1$ respectively. Its output terminal is connected through buffer circuit $A_4$ to auxiliary memory 19, and also connected to the gate of each of transistors $17_1, 17_2, \ldots$ The junction between the output of the buffer circuit $A_3$ and the input terminal of each of the buffer circuits $A_4$ and $A_5$ is indicated at $B_2$.

In this embodiment, like the embodiment of FIG. 11, if the memory bit cells connected to the drive line $W_1$ of the main memory 18 do not include any error bit cell, the high resistance polysilicon element $R_P$ remains in the high resistance state so that the output level of the control circuit $C_1$ is "0". In this case, the buffer circuit $A_3$ has no influence on the level of the junction $B_1$. The main memory 18 is thus selected.

If there is an error bit cell connected to the drive line $W_1$, in which case the high resistance polysilicon element $R_P$ is rendered in the low resistance state, the control circuit $C_1$ provides a "1" level output. In this case, the buffer circuit $A_3$ changes the level on the junction $B_2$ according to the level on the output line $R_1$ of the decoder 11 to access the auxiliary memory 19.

Figure 18:
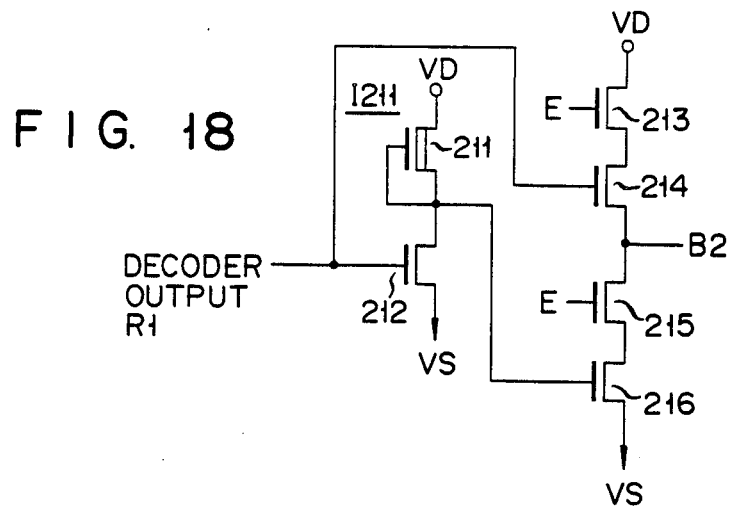
FIG. 18 is a circuit diagram showing a buffer circuit in the embodiment of FIG. 17.

FIG. 18 shows an example of the buffer circuit $A_3$.

This circuit includes an inverter $I_{211}$ consisting of a depletion type MOS transistor 211 and an enhancement type MOS transistor 212, these transistors being connected in series between the potential source VD and reference potential source VS, and MOS transistors 213 to 216 connected in series in the mentioned order between the potential source VD and reference potential source VS from the side of the potential source VD. The gate of the transistor 212 in the inverter $I_{211}$ and the gate of the second transistor 214 in the series MOS transistor circuit are connected to the output line $R_1$ of the decoder 11. The gate of each of the transistors 213 and 215 in the series MOS transistor circuit is connected to the output terminal E of the control circuit $C_1$. The output terminal of the inverter $I_{211}$, i.e., the junction between the transistors 211 and 212, is connected to the gate of the fourth transistor 216 in the series MOS transistor circuit. The junction between the transistors 124 and 125 of the series MOS transistor circuit constitutes the output terminal of the buffer circuit $A_3$.

With the above construction, if the memory bit cells connected to the drive line $W_1$ of the main memory 18 do not include any error bit cell, the output level of the control circuit $C_1$ is "0", and the gate level on the first and third transistors 213 and 215 of the series MOS transistor circuit is "0" to hold these transistors 213 and 215 "off". In this state, the level of the junction $B_2$ is not affected at all by the level of the output line $R_1$ of the decoder 11. On the other hand, if the memory bit cells include an error bit cell, the output level of the control circuit $C_1$ is "1". In this case, the gate level on the first and third transistors 213 and 215 in the series MOS transistor circuit is "1" to hold these transistors 213 and 215 "on". In this case, the level of the output line $R_1$ of the decoder 11 is changed according to the level of the junction $B_2$. More specifically, when the output line $R_1$ is selected so that its level becomes "1", the transistor 212 in the inverter $I_{211}$ and the second transistor 214 of the series MOS transistor circuit are turned on. With the transistor 212 turned on, the output level of the inverter $I_{211}$ becomes "0" to turn off the transistor 216. The output level of the buffer circuit $A_3$ thus becomes "1". A "1" level output is thus provided from the junction $B_2$. This "1" level signal is fed through the buffer device $A_4$ in the memory device of FIG. 17 to the auxiliary memory 19. The auxiliary memory 19 is thus selected and rendered operative. The "1" level signal from the buffer circuit $A_3$ is also fed through the buffer circuit $A_5$ to the gate of each of the transistors $17_1, 17_2, \ldots$ to turn on these transistors.

Figure 19:
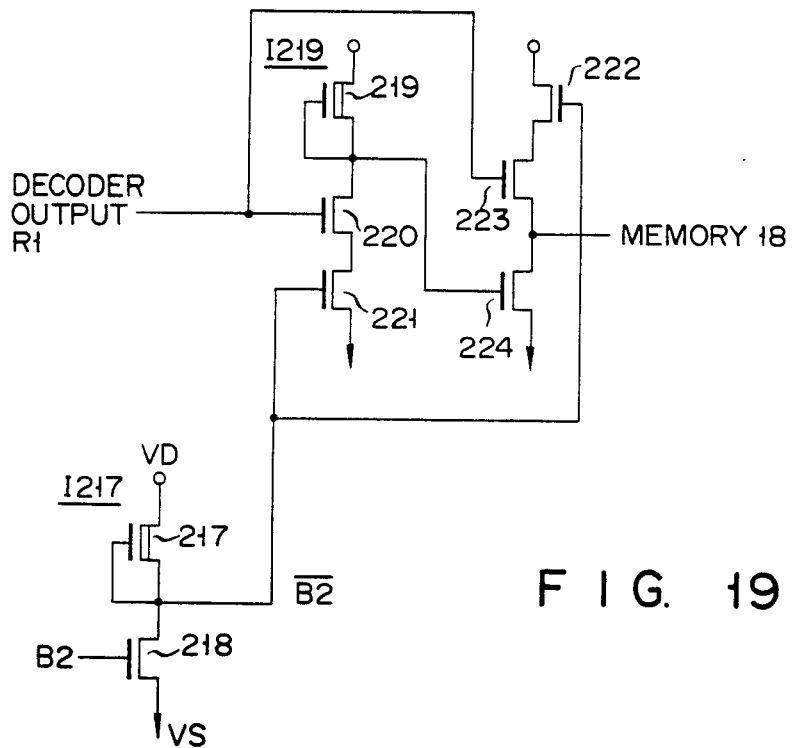
FIG. 19 is a circuit, diagram showing a buffer circuit in the embodiment of FIG. 17.

FIG. 19 shows an example of the buffer circuit $A_2$ in the memory device of FIG. 17. This circuit includes an inverter $I_{217}$ consisting of a depletion type MOS transistor 217 and an enhancement type MOS transistor 218, these transistors being connected in series between the potential source VD and reference potential source VS. It also includes another inverter $I_{219}$ consisting of a depletion type MOS transistor 219 and an enhancement type MOS transistor 220, these transistors being connected in series between the potential source VD and reference potential source VS. It further includes a MOS transistor 221 connected between the inverter $I_{219}$ and reference potential source VS and transistors 222 to 224 connected in series in the given order between the potential source VD and reference potential source VS. The gate of the transistor 218 in the inverter $I_{217}$ is connected to the junction $B_2$ in the memory device of FIG. 17. The gate of the transistor 220 in the inverter $I_{219}$ and the gate of the second transistor 223 in the series MOS transistor are connected to the output line $R_1$ of the decoder 11. The gate of the transistor 221 and the gate of the first transistor 222 in the series MOS transistor circuit are connected to the output terminal of the inverter $I_{217}$, i.e., the junction between the transistors 217 and 218. The gate of the third transistor 224 in the series MOS transistor circuit is connected to the output terminal of the inverter $I_{219}$, i.e., the junction between the transistors 219 and 220. The junction between the transistors 223 and 224 constitutes the output terminal of the buffer circuit $A_2$.

With the above construction, if the memory bit cells connected to the drive line $W_1$ of the main memory 18 do not include any error bit cell, the selection of the output line $R_1$ of the decoder 11 to the "1" level sets the junction $B_2$ to the "0" level. As a result, the transistor 218 of the inverter $I_{217}$ is turned off to change the output level of the inverter $I_{217}$ to "1". The gate potential level on the transistors 221 and 222 thus becomes "1" to turn on these transistors 221 and 222. Meanwhile, with the selection of the output line $R_1$ to the "1" level, the transistors 220 and 223 are turned on. The buffer circuit $A_2$ thus provides an output at the same level as the input level, i.e., "1". The main memory 18 is thus selected and rendered operative. If the memory bit cells connected to the drive line $W_1$ include an error bit cell, with the selection of the output line $R_1$ to the "1" level the level of the junction $B_2$ becomes "1". As a result, the transistor 218 in the inverter $I_{217}$ is turned on. The output level of the inverter $I_{217}$ thus becomes "0" to turn off the transistors 221 and 222. In this case, the buffer circuit $A_2$ provides a "0" level output so that the main memory 19 is not selected and rendered inoperative. In this example, the transistors 221 and 222 are used in lieu of the transistor $17_1$ in the embodiment of FIG. 17. Where this buffer circuit is used, the transistor $17_1$ in the memory device of FIG. 17 is thus unnecessary.

In the embodiments shown in FIGS. 11 through 16 and FIGS. 17 through 19, a transistor circuit is provided between the decoder and auxiliary memory and is on-off controlled according to whether or not a single polysilicon fuse element incorporated in its on-off control circuit is burned out or whether a single high resistance polysilicon element in the on-off control circuit is changed to the low resistance state. The auxiliary memory can thus be readily and reliably selected and rendered operative.

Figure 20A:
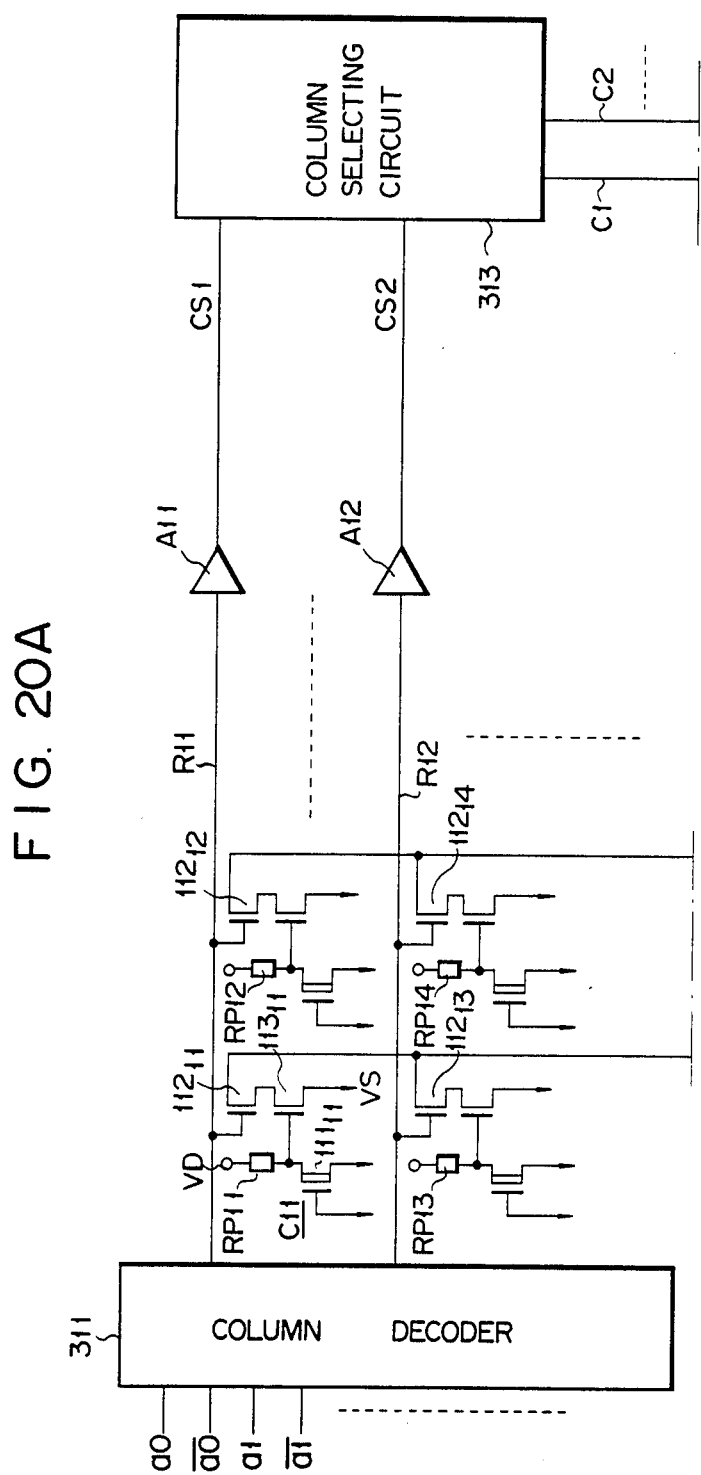
FIGS. 20A and 20B are schematic representations of a still further embodiment of the semiconductor memory device according to the invention.
Figure 20B:
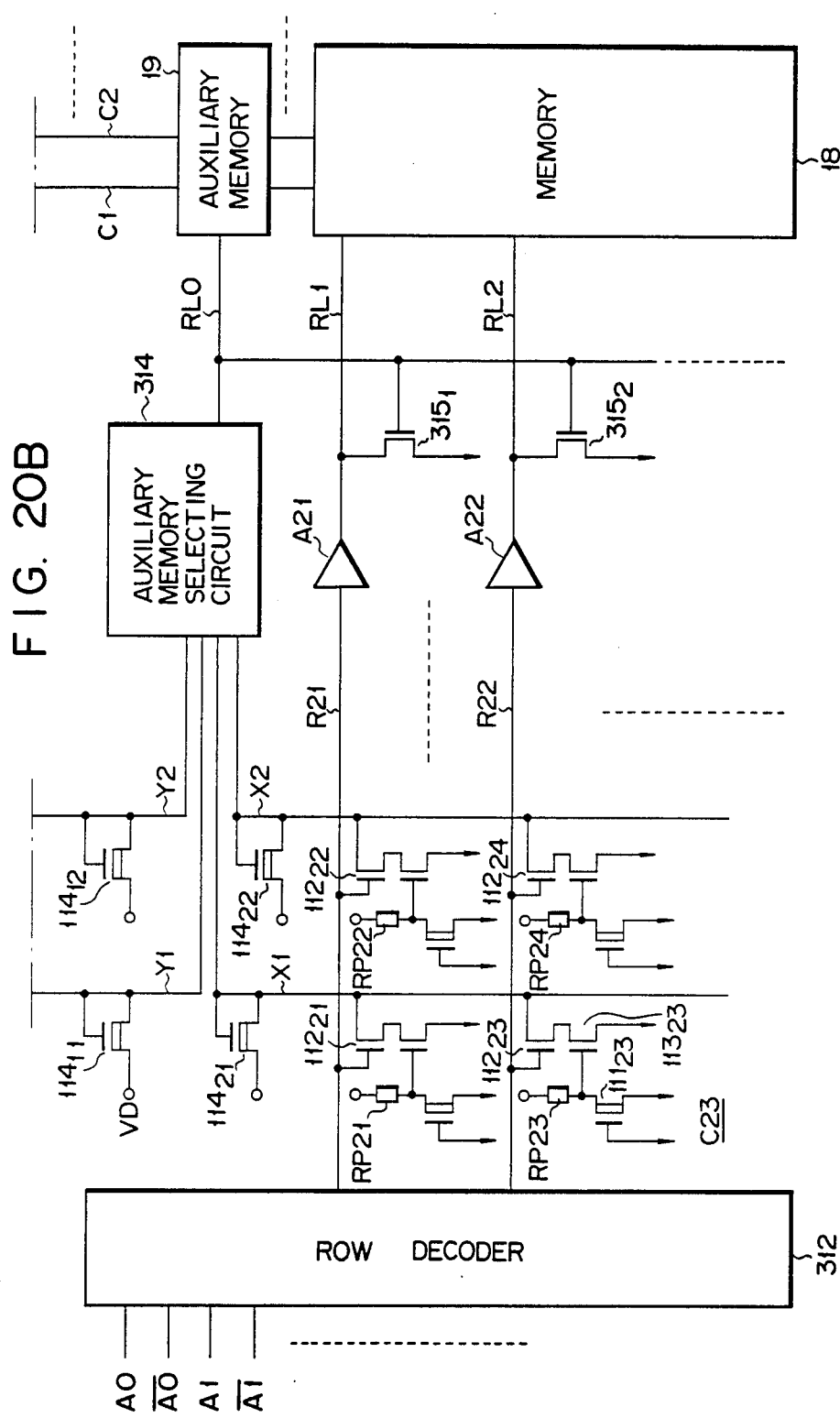

FIGS. 20A and 20B show a further embodiment of the memory device according to the invention. In this embodiment, the invention is applied to both row and column line circuits. In this embodiment, parts similar to those in the preceding embodiments are designated by like reference numerals and symbols.

A column decoder 311 decodes address input signals $a_0, \overline{a_0}, a_1, \overline{a_1}, \ldots$ to select one of its output lines $R_{11}, R_{12}, \ldots$ A row decoder 312 similarly decodes address input signals $A_0, \overline{A_0}, A_1, \overline{A_1}, \ldots$ to select one of its output lines $R_{21}, R_{22}, \ldots$ The output lines $R_{11}, R_{12}, \ldots$ of the column decoder 311 are connected through respective buffer circuits $A_{11}, A_{12}, \ldots$ to corresponding column selecting lines $CS_1, CS_2, \ldots$ of a column selecting circuit 313. The column selecting circuit 313 is connected to column lines $C_1, C_2, \ldots$ which are common to a main memory 18 and an auxiliary memory 19. The output lines $R_{21}, R_{22}, \ldots$ of the row decoder 312 are connected through respective buffer circuits $A_{21}, A_{22}, \ldots$ to corresponding drive lines $R_{L1}, R_{L2}, \ldots$ of the main memory 18. The output lines $R_{11}, R_{12}, \ldots$ of the column decoder 311 and the output lines $R_{21}, R_{22}, \ldots$ of the row decoder 312 are each provided with a transistor circuit consisting of transistors generally designated at 112 and 113. These output lines are also provided with respective control circuits $C_{11}, C_{12}, \ldots$, each of which includes a high resistance polysilicon element generally designated at $R_P$ for controlling the transistor 113 and a depletion type MOS transistor generally designated at 111. The construction of the transistor circuits and control circuits $C_{11}, C_{12}, \ldots$ is substantially the same as in the embodiment of FIG. 11, so the component elements are designated by the same reference numerals and symbols with a suffix.

The output lines leading from the respective transistors $112_{11}, 112_{13}, \ldots$ are commonly connected via a line $Y_1$ to an auxiliary memory selecting circuit 314. The output lines leading from the transistors $112_{12}, 112_{14}, \ldots$ are commonly connected via a line $Y_2$ to the auxiliary memory selecting circuit 314. The output lines leading from the transistors $112_{21}, 112_{23}, \ldots$ are commonly connected via a line $X_1$ to the auxiliary memory selecting circuit 314. The output lines leading from the transistors $112_{22}, 112_{24}, \ldots$ are connected via a line $X_2$ to the auxiliary memory selecting circuit 314. The auxiliary memory selecting circuit 314 has its output terminal connected to a drive line $R_{L0}$ of the auxiliary memory 19. The drive lines $R_{L1}, R_{L2}, \ldots$ of the main memory 18 are connected through respective MOS transistors $315_1, 315_2, \ldots$ to a reference potential source VS. The gate of each of the transistors $315_1, 315_2, \ldots$ is connected to the output terminal of the auxiliary memory selecting circuit 314.

In the memory device of FIGS. 20A and 20B having the above construction, the column decoder 311 can select one of the column lines $CS_1, CS_2, \ldots$ and set it to the "1" level according to the address input signals $a_0, \overline{a_0}, a_1, \overline{a_1}, \ldots$ When a column selecting line is selected, the column selecting circuit 313 selects the corresponding column line. For example, when the column selecting line $CS_1$ is set to the "1" level, the corresponding column line $C_1$ is selected. Data is read out from a memory bit cell at the intersection between the selected drive and column lines.

It is now assumed that the memory bit cell selected by the column line $C_1$ and drive line $R_{L2}$ is an error bit cell. In this case, the high resistance polysilicon elements $R_{P11}$, and $R_{P23}$ in the respective control circuits $C_{11}$ and $C_{23}$ are changed a low resistance state by laser annealing, for instance. When these high resistance polysilicon elements $R_{P11}$ and $R_{P23}$ are rendered in the low resistance state, the gate potential on the transistors $113_{11}$ and $113_{23}$ is changed to "1" so that these transistors are turned on. In this state, the level of the lines $X_1$ and $Y_1$ is determined by the state of the transistors $112_{11}, 112_{23}$; the level of the line $Y_1$ is "0" if the transistor $112_{11}$ is "on" and "1" if the transistor $112_{11}$ is "off", and the level on the line $X_1$ is "0" if the transistor $112_{23}$ is "on" and "1" if the transistor $112_{23}$ is "off". It is now assumed that the column line $C_1$ and drive line $R_{L2}$ are selected and set to the "1" level by the respective column and row decoders 311 and 312 with the high resistance polysilicon elements $R_{P11}$ and $R_{P23}$ in the low resistance state. This occurs when the address input signals to the decoders 311 and 312 are such as to select the error bit cell at the intersection between the column line $C_1$ and drive line $R_{L2}$. In this case, the transistors $112_{11}$ and $112_{23}$ are both turned on to set the lines $Y_1$ and $X_1$ to the "0" level. With the lines $X_1$ and $Y_1$ both set to the "0" level, the auxiliary memory selecting circuit 314 provides a "1" level signal to the output line $R_{L0}$. The auxiliary memory 19 is thus selected and rendered operative. The "1" level output of the auxiliary memory selecting circuit 314 is also applied to the gate of the transistors $315_1, 315_2, \ldots$ connected between the respective drive lines $R_{L1}, R_{L2}, \ldots$ of the main memory 18 and the reference potential source VS to turn on these transistors $315_1, 315_2, \ldots$ Thus, the main memory 18 is not selected and rendered inoperative when the auxiliary memory 19 is selected and rendered operative.

If the main memory 18 has another error bit cell, the high resistance polysilicon elements corresponding to that error bit cell among those $R_{P12}, R_{P14}, \ldots$ and $R_{P22}, R_{P24}, \ldots$ connected to the lines $Y_2$ and $X_2$ are rendered in the low resistance state. With these high resistance polysilicon elements in the low resistance state, when the address input signals are supplied to select that error bit cell, the level of both the lines $X_2$ and $Y_2$ becomes "0". The output level of the auxiliary memory selecting circuit 314 thus becomes "1" to select the auxiliary memory 19. It is to be noted that if there are two error bit cells, the auxiliary memory selecting circuit 314 provides a "1" level signal to select the auxiliary memory 19 only when the level of both the lines $X_1$ and $Y_1$ or the level of both the lines $X_2$ and $Y_2$ becomes "0". In the embodiment of FIG. 20, the memory bit cells of the auxiliary memory 19 are arranged such that the row lines thereof can be selected by the auxiliary memory selecting circuit 314. However, it is also possible to arrange the memory bit cells of the auxiliary memory 19 such that the column lines thereof can be selected.

Figure 21:
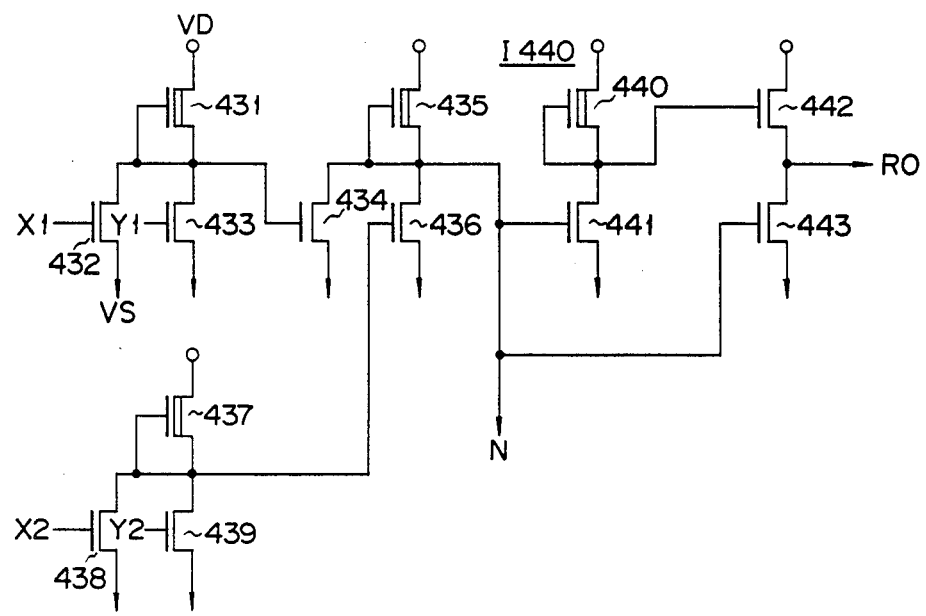
FIG. 21 is a circuit diagram showing an auxiliary memory selecting circuit in the embodiment of FIG. 20.

FIG. 21 shows an example of the auxiliary memory selecting circuit 314 in the memory device of FIGS. 20A and 20B. This circuit includes a depletion type MOS transistor 431 having one terminal connected to potential source VD, MOS transistors 432 and 433 each having one terminal connected through the transistor 431 to the potential source VD and the other terminal connected to the reference potential source VS, a depletion type MOS transistor 435 having one terminal connected to the potential source VD, and MOS transistors 434 and 436 each having one terminal connected through the transistor 435 to the potential source VD and the other terminal connected to the reference potential source VS. It further includes a depletion type MOS transistor 437 having one terminal connected to the potential source VD and MOS transistors 438 and 439 each having one terminal connected through the transistor 437 to the potential source VD and the other terminal connected to the reference potential source VS. It further includes an inverter $I_{440}$ consisting of a depletion type MOS transistor 440 and an enhancement type MOS transistor 441, these transistors being connected between the potential source VD and reference potential source VS. It further includes two MOS transistors 442 and 443 connected in series in the given order between the potential source VD and reference potential source VS from the side of the potential source VD. The transistors 431, 432 and 433 constitute a NOR gate. The transistors 434, 435 and 436 constitute another NOR gate. The transistors 437, 438 and 439 constitute a still another NOR gate. The gate of the transistor 432 is connected to the signal line $X_1$ in the memory device of FIG. 20. The gate of the transistor 433 is connected to the signal line $Y_1$. The gate of the transistor 438 is connected to the signal line $X_2$. The gate of the transistor 439 is connected to the signal line $Y_2$. The gate of the transistor is connected to the junction between the transistors 432 and 433. The gate of the transistor 436 is connected to the junction between the transistors 438 and 439. The gate of the transistor 441 is connected to the junction between the transistors 435 and each of the transistors 434 and 436. The gate of the transistor 442 is connected to the output terminal of the inverter $I_{440}$, i.e., the junction between the transistors 440 and 441. The junction between the transistors 442 and 443 constitutes the output terminal of this auxiliary memory selecting circuit 314, and is connected to the drive line $R_{L0}$. The junction between the transistor 435 and each of the transistors 434 and 436 constitutes a node N.

With the above construction, if the address input signals do not designate the address of an error memory cell, the level of one or both of the signal lines $X_1$ and $Y_1$ is "1". Also, the level of one or both of the signal lines $X_2$ and $Y_2$ is "1". The gate of the transistors 434 and 436 is thus at the "0" level so that these transistors are "off". The gate of the transistors 441 and 443, i.e., the node N, is thus at the "1" level so that these transistors are "on". With the transistor 441 "on", the gate level of the transistor 442 is "0" to render the transistor 442 turned off. With the transistor 442 "off" and the transistor 443 "on", the output of the auxiliary memory selecting circuit 314 is at the "0" level to keep the drive line $R_{L0}$ at the "0" level. The auxiliary memory 19 is thus not selected and rendered inoperative.

When the error bit cell is designated by the address input signals, the level of both the signal lines $X_1$ and $Y_1$ becomes "0". As a result, the gate level on the transistor 434 becomes "1" to turn on this transistor. The level on the node N thus becomes "0" to turn off the transistors 441 and 443. With the transistor 441 turned off, the gate level of the transistor 442 becomes "1" to turn on the transistor 442. With the transistor 442 turned on and the transistor 443 turned off, the output level of the auxiliary memory selecting circuit 314 becomes "1". The level of the drive line $R_{L0}$ thus becomes "1" so that the auxiliary memory 19 is selected and rendered operative. When the level of both the signal lines $X_1$ and $Y_1$ becomes "0", the same operation takes place to change the output level of the circuit 314 to "1", thus the auxiliary memory 19 is selected and rendered operative.

Figure 22:
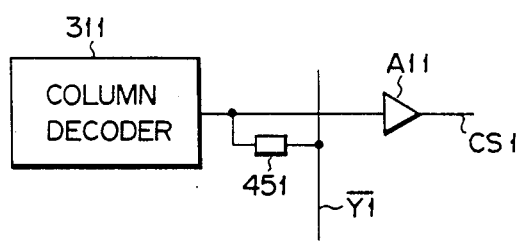
FIG. 22 is view showing a modification of a circuit arrangement including a control circuit in the embodiment of FIG. 20.

FIG. 22 shows a modification of the circuit consisting of the high resistance polysilicon element $R_P$ and transistors 111, 112 and 113 in the memory device of FIG. 22. In this circuit, a single high resistance polysilicon element 451 is used instead of the circuit in the construction of FIG. 22 noted above. The high resistance polysilicon element 451 is connected at one terminal to the output line $R_{11}$ of the decoder 311 and at the other terminal to a signal line $X_1$ complementary to the signal line $X_1$. If the memory bit cells connected to the column line $C_1$ of the main memory 18 include an error bit cell, the high resistance polysilicon element 451 is changed to the low resistance state by laser annealing, for example. With the high resistance polysilicon element 451 in the low resistance state, when the output line $R_{11}$ of the decoder 311 is selected so that its level becomes "1", this "1" level signal is led through the element 451 in the low resistance state to the signal line $\overline{Y_1}$, thus setting the signal line $\overline{Y_1}$ to "1". The circuit of FIG. 22 described above is also applicable to the output lines $R_{21}$, $R_{22}$, . . . of the decoder 312. When the level of both the signal lines $\overline{X_1}$ and $\overline{Y_1}$ becomes "1", the auxiliary memory selecting circuit 314 provides the "1" level output, so that the auxiliary memory 19 is selected and rendered operative.

Figure 23:
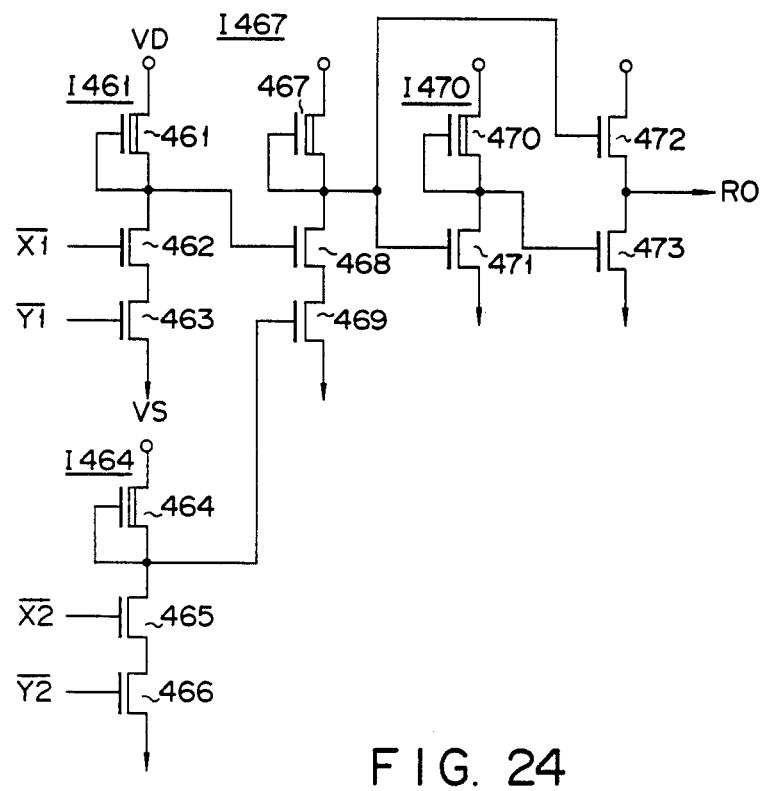
FIG. 23 is a circuit diagram showing an auxiliary memory selecting circuit suited for use with the circuit arrangement of FIG. 22.

FIG. 23 shows an example of the auxiliary memory selecting circuit 114 in the memory device of FIGS. 20A and 20B incorporating the construction of FIG. 22.

The circuit includes a NAND gate $I_{461}$ having a depletion type MOS transistor 461 and enhancement type MOS transistors 462 and 463, these transistors being connected in series between the potential source VD and reference potential source VS. It also includes another NAND gate $I_{464}$ having a depletion type MOS transistor 464 and enhancement type MOS transistors 465 and 466, these transistors being connected in series between the potential source VD and reference potential source VS. It further includes a third NAND gate $I_{467}$ having a depletion type MOS transistor 467 and enhancement type MOS transistors 468 and 469, these transistors being connected in series between the potential source VD and reference potential source VS. It further includes an inverter $I_{470}$ having a depletion type MOS transistor 470 and an enhancement type MOS transistor 471, these transistors being connected in series between the potential source VD and reference potential source VS. It further includes two MOS transistors 472 and 473 connected in series between the potential source VD and reference potential source VS. The transistors 462, 463, 465 and 466 have their gates respectively connected to signal lines $\overline{X_1}$, $\overline{Y_1}$, $\overline{X_2}$ and $\overline{Y_2}$. The gate of the transistor 468 is connected to the output terminal of the NAND gate $I_{461}$, i.e., the junction between the transistors 461 and 462. The gate of the transistor 469 is connected to the output terminal of the NAND gate $I_{464}$, i.e., the junction between the transistors 464 and 465. The gate of the transistor 471 is connected to the output terminal of the NAND gate $I_{467}$, i.e., the junction between the transistors 467 and 468. The gate of the transistor 472 is connected to the output terminal of the NAND gate $I_{467}$. The gate of the transistor 473 is connected to the output terminal of the inverter $I_{479}$, i.e., the junction between the transistors 470 and 471. The junction between the transistors 472 and 473 constitutes the output terminal of this auxiliary memory selecting circuit 314. With the above construction, when address input signals designating an error bit cell appear, the level of both the signal lines $\overline{X_1}$ and $\overline{Y_1}$ becomes "1" to turn on the transistors 462 and 463. The gate level on the transistor 468 thus becomes "0" to turn off the transistor 468. The gate level on the transistors 471 and 472 thus becomes "1" to turn on these transistors 471 and 472. With the transistor 471 turned on, the gate level on the transistor 473 becomes "0" to turn off the transistor 473. The level of the junction between the transistors 472 and 473, i.e., the output level of the auxiliary memory selecting circuit 314, thus becomes "1", so that the auxiliary memory 19 is selected and rendered operative. When the level of the signal lines $\overline{X_2}$ and $\overline{Y_2}$ becomes "1", the same operation takes place to select the auxiliary memory 19.

Figure 24:
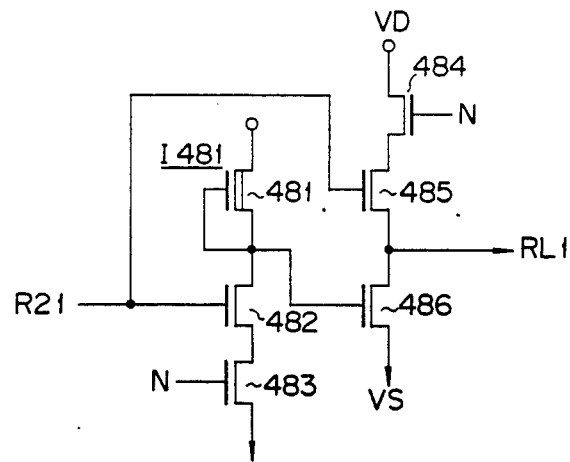
FIG. 24 is a circuit diagram showing a buffer circuit in the embodiment of FIG. 20.

FIG. 24 shows an example of the buffer circuit $A_{21}$ in the memory device of FIG. 20. The circuit includes a NAND gate $I_{481}$ having a depletion type MOS transistor 481 and enhancement type MOS transistors 482 and 483, these transistors being connected in series in the mentioned order between the potential source VD and reference potential source VS from the side of the potential source VD. It also includes MOS transistors 484 to 486 connected in series between the potential source VD and reference potential source VS. The gate of each of the transistors 482 and 485 is connected to the output line $R_{21}$. The output terminal of the NAND gate $I_{481}$, i.e., the junction between the transistors 481 and 482, is connected to the gate of the transistor 486. The gate of each of the transistors 483 and 484 is connected to the node N in the circuit of FIG. 21. The junction between the transistors 485 and 486 constitutes the output terminal of this buffer circuit $A_{21}$, and is connected to the drive line $R_{L1}$.

With the above construction, when address input signals designating an error bit cell appear, the level on the node N becomes "0" to turn off the transistors 483 and 484. With the transistor 483 turned off, the output level of the NAND gate $I_{481}$ becomes "1" to turn on the transistor 486. The output level of the buffer circuit $A_{21}$ thus becomes "0". The level of the drive line $R_{L1}$ is thus set to "0" so that the main memory 18 is not accessed. When a correct bit cell is designated by the address input signals, the node N is at the "1" level. In this case, a signal of the level corresponding to the level of the output line $R_{21}$ of the decoder 312 is thus provided. To be more specific, the buffer circuit $A_{21}$ provides a "1" level output if the level of the output line $R_{21}$ is "1", while it provides a "0" level output if the output line level is "0". When the level on the node N is set to "1", the transistors 483 and 484 are turned on. When the level of the output line $R_{21}$ becomes "1" in this state, the transistors 482 and 485 are turned on. With the transistor 482 turned on, the gate level of the transistor 486 becomes "0" to turn off the transistor 486. The output level of the buffer circuit $A_{21}$ thus becomes "1". On the other hand, when the level of the output line $R_{21}$ becomes "0", the transistors 482 and 485 are turned off. With the transistor 482 turned off, the gate level of the transistor 486 becomes "1" to turn on the transistor 486. The output level of the buffer circuit $A_{21}$ thus becomes "0".

Figure 25:
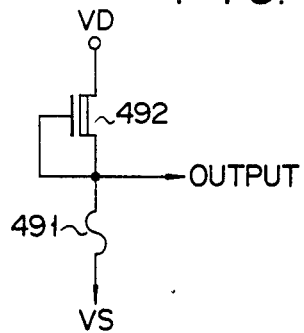
FIGS. 25, 26 and 27 are circuit diagrams showing respective modifications of a control circuit in the embodiment of FIG. 20.
Figure 26:
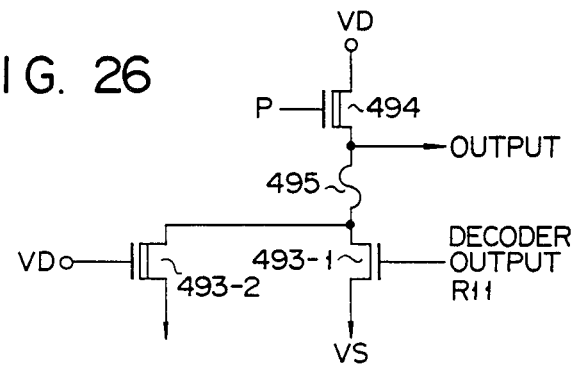
Figure 27:
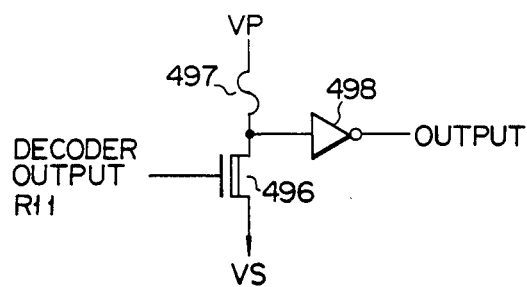

FIGS. 25, 26 and 27 show circuits which use a polysilicon fuse element which can be used in place of the high resistance polysilicon element $R_P$ in the memory device of FIGS. 20A and 20B.

In the circuit of FIG. 25, a fuse element is connected at one terminal to the reference potential source VS and at the other terminal through a depletion type MOS transistor 492 to the potential source VD. The junction between the fuse element 491 and transistor 492 constitutes the output terminal of this circuit. If the memory bit cells connected to the column line $C_1$ of the main memory 18 include an error bit cell, the fuse element 491 is burned out by irradiation thereof with a laser beam, for instance. With the fuse element 491 burned out, a "1" level output is provided.

In the circuit of FIG. 26, a fuse element 495 is connected at one terminal through a depletion type MOS transistor 494 to the potential source VD. The other terminal of the fuse element 495 is connected to the reference potential source VS through an enhancement type MOS transistor 493-1 and a depletion type MOS transistor 493-2 parallel connected each other. A pulse P is applied to the gate of the transistor 494. The gate of the transistor 493-1 is connected to the output line $R_{11}$ of the decoder 311. The gate of the transistor 493-2 is connected to the potential source VD. If the bit memory cells connected to the column line $C_1$ include an error bit cell, the fuse element 495 is burned out. It is burned out when address input signals designating the address of the error bit cell are generated. To be more specific, when these address input signals appear, the transistor 493 is turned on. At this time, the pulse signal $P_1$ is set to "1", thus turning on the transistor 494. A large current is thus caused to flow through the fuse element 495 and it is burned out by Joule heat at this time. With the fuse element 495 burned out, a "1" level signal is provided. While the fuse element 495 not burn out, a "0" level signal is provided through the transistor 493-2.

In the circuit of FIG. 27, a polysilicon fuse element 497 is connected at one terminal to a high potential source VP and at the other terminal through a depletion type MOS transistor 496 to the reference potential source VS. The junction between the fuse element 497 and transistor 496 is connected through an inverter 498 to the output terminal. The gate of the transistor 496 is connected to the output line $R_{11}$ of the decoder 311. If the memory bit cells connected to the column line $C_1$ of the main memory 18 include an error bit cell, the fuse element 497 is burned out. This is done when address input signals designating the error bit cell are input. To be more specific, when these address input signals are input, the transistor 496 is turned on. Then, the voltage of the potential source VP is made about 15 V to cause a large current to flow through the fuse element 497, whereby the fuse element 497 is burned out. When the fuse element 497 is burned out, the voltage of the potential source VP is returned to the potential VD and the input level applied to the inverter 498 is "0" so that the output level thereof is "0".

In the embodiment of FIGS. 20A and 20B through 27 described above, a transistor circuit is provided between the column decoder and auxiliary memory and is on-off controlled depending upon whether a single polysilicon fuse element incorporated in the control circuit is burned out or not or a single high resistance polysilicon element in the control circuit is changed to the low resistance state or not. In addition, a similar transistor circuit is provided between the row decoder and auxiliary memory and is similarly on-off controlled. Thus, the auxiliary memory can be readily and reliably selected and rendered operative.

As has been described in the foregoing, according to the invention it is possible to provide a semiconductor memory device with which the auxiliary memory can be easily and simply accessed, and which improves both the reliability and the probability of access to the auxiliary memory.

What we claim is:

1. A semiconductor memory device for providing error correction, said memory device being coupled to a source of power, being responsive to an address signal, and comprising:
   a main memory including main memory word lines connected to different ones of a plurality of main memory cells;
   an auxiliary memory including auxiliary memory word lines;
   a decoder for decoding said address signal and for producing a decoded address signal identifying one of said main memory word lines;
   selecting means for selecting one of said main memory word lines and a corresponding one of said auxiliary memory word lines according to said decoded address signal, said selecting means including at least one first MOS transistor having an output current path connected between said selected one main memory word line and said corresponding selected one auxiliary memory word line, and having a gate supplied with a control signal, whereby said selecting means selects said main memory word line when said control signal has a first logic level, and selects said corresponding selected one auxiliary memory word line when said control signal has a second logic level; and
   control means for generating said control signal at said first logic level when all of said main memory cells connected to said selected one main memory word line are correct, and for generating said control signal at said second level when any of said main memory cells connected to said selected one main memory word line is in error, said control means including:
   a fuse element being set in a first state if all of said main memory cells connected to said selected one main memory word line are correct, and being set in a second state if any of said main memory cells connected to said selected one main memory word line is in error, said fuse element having one end connected to said power source,
   a second MOS transistor having a current path connected between a second end of said fuse element and a reference voltage, and having a gate also connected to said reference voltage, and
   an inverter having an input terminal connected to the junction of said fuse element and said second MOS transistor, and having an output terminal constituting an output terminal of said control means and producing said control signal, said output terminal of said inverter being connected to said gate of said first MOS transistor of said selecting means.

2. A semiconductor memory device according to claim 1, wherein said control means further includes
   a third MOS transistor having a current path inserted between said first MOS transistor and said reference voltage and
   a fourth MOS transistor having a current path inserted between said inverter and said power source, the gates of said third and fourth MOS transistors being connected to an output terminal of said decoder.

3. A semiconductor memory device according to claim 1, wherein said control means further include a burning circuit for burning said fuse element, said burning circuit comprising third and fourth MOS transistors having current paths inserted in series between the junction of said fuse element and said first MOS transistor and said reference voltage, the gate of the third MOS transistor being connected to an output terminal of said decoder and the gate of the fourth MOS transistor being supplied with a fuse burning control signal for causing the fourth MOS transistor to be turned on when said fuse element is burned out.

4. A semiconductor memory device according to claim 1, wherein said control means further includes a burning circuit for burning said fuse element, said burning circuit comprising
   a second inverted connected between said power source and said reference voltage, an input terminal of the second inverter being connected to an output terminal of said decoder;
   a third MOS transistor having a current path inserted between said second inverter and said reference voltage, and having a gate being supplied with a fuse control signal for turning the third transistor on when the fuse element is burned out;
   a third inverter connected between said power source and said reference voltage, an input terminal of the third inverter being connected to an output terminal of said second inverter;
   a fourth MOS transistor having a current path connected between the output terminal of said third inverter and said reference voltage, and having a gate being supplied with an inverted fuse control signal which is complementary to said fuse control signal; and
   a fifth MOS transistor having a current path connected between the junction of the fuse element and said first MOS transistor and said reference voltage, and having a gate conected to the output terminal of said decoder.

5. A semiconductor memory device for providing error correction, said memory device being coupled to a source of power, being responsive to an address signal, and comprising:
   a main memory including main memory word lines connected to different ones of a plurality of main memory cells;
   an auxiliary memory including auxiliary memory word lines;
   a decoder for decoding said address signal and for producing a decoded address signal identifying one of said main memory word lines;
   selecting means for selecting one of said main memory word lines and a corresponding one of said auxiliary memory word lines according to said decoded address signal, said selecting means including at least one first MOS transistor having an output current path connected between said selected one main memory word line and said corresponding selected one auxiliary memory word line, and having a gate supplied with a control signal, whereby said selecting means selects said main memory word line when said control signal has a first logic level, and selects said corresponding selected one auxiliary memory word line when said control signal has a second logic level; and
   control means for generating said control signal at said first logic level when all of said plurality of memory cells connected to said selected one main memory word line are correct, and for generating said control signal at said second logic level when any of said plurality of main memory cells connected to said selected one main memory word line is in error, said control means including
- a second MOS transistor having an output path connected between said power source and a gate of said second MOS transistor,
- a high-resistance polysilicon connected between a reference voltage and said gate of said second MOS transistor, said high-resistance polysilicon being in a first state when all of the main memory cells connected to said selected one main memory word line are correct and said high-resistance polysilicon being in a second state when any of said main memory cells connected to said selected one main memory word line is in error, and
- an inverter having an input terminal connected to the junction of said high-resistance polysilicon and said second MOS transistor, and having an output terminal constituting an output terminal of said control means and producing said control signal, said output terminal of said inverter being connected to said gate of said first MOS transistor of said selecting means.

6. A semiconductor memory device according to claim 5, wherein said control means further includes
- a third MOS transistor having a current path inserted between said polysilicon and said reference voltage, and
- a fourth MOS transistor having a current path inserted between said inverter and said power source, the gates of said third and fourth MOS transistors being connected to an output terminal of said decoder.

7. A semiconductor memory device for providing error correction, said memory device being coupled to a source of power, being responsive to an address signal, and comprising:
- a main memory including main memory word lines connected to different ones of a plurality of main memory cells;
- an auxiliary memory including auxiliary memory word lines; a decoder for decoding said address signal and for producing a decoded address signal identifying one of said main memory word lines;
- selecting means for selecting one of said main memory word lines and a corresponding one of said auxiliary memory word lines according to said decoded address signal, said selecting means including at least one first MOS transistor having an output current path connected between said selected one main memory word line and said corresponding selected one auxiliary memory word line, and having a gate supplied with a control signal, whereby said selecting means selects said main memory word line when said control signal has a first logic level, and selects said corresponding selected one auxilry memory word line when said control signal has a second logic level; and
- control means for generating said control signal at said first logic level when all of the main memory cells connected to said selected one main memory word line are correct, and for generating said control signal at said second logic level when any of said main memory cells connected to said selected one main memory word line is in error; and
- buffer means inserted between said decoder and said main memory, said buffer means including
  - a first inverter connected between said power source and a reference voltage, said first inverter having an input terminal connected to the junction of said first MOS transistor and said auxiliary memory,
  - a second inverter connected between said power source and said reference voltage, said second inverter having an input terminal connected to an output terminal of said decoder,
  - a second MOS transistor having a current path connected between said second inverter and said reference voltage, and having a gate connected to an output terminal of said first inverter; and
  - third, fourth and fifth MOS transistors having current paths connected in series between said power source and said reference voltage, said third transistor being connected to said power source and said fifth transistor being connected to said reference voltage, said third transistor having a gate connected to said output terminal of said first inverter, said fourth transistor having a gate connected to said output terminal of said decoder, said fifth transistor having a gate connected to an output terminal of said second inverter, and the junction of said fourth and fifth transistors being connected to said main memory.

8. A semiconductor memory device for providing error correction, said memory device being coupled to a source of power, being responsive to an address signal, and comprising:
- a main memory including main memory word lines connected to different ones of a plurality of main memory cells;
- an auxiliary memory including auxiliary memory word lines;
- a decoder for decoding said address signal and for producing a decoded address signal identifying one of said main memory word lines;
- selecting means for selecting one of said main memory word lines and a corresponding one of said auxiliary memory word lines according to said decoded address signal, said selecting means including at least one first MOS transistor having an output current path connected between said selected one main memory word line and said corresponding selected one auxiliary memory word line, and having a gate supplied with a control signal, whereby said selecting means selects said main memory word line when said control signal has a first logic level, and selects said corresponding selected one auxiliary memory word line when said control signal has a second logic level; and
- control means for generating said control signal at said first logic level when all of the main memory cells connected to said selected one main memory word line are correct, and for generating said control signal at said second logic level when any of said main memory cells connected to said selected one main memory word line is in error; and
- means for inhibiting the selection of said selected one main memory word line when said corresponding selected one auxiliary memory word line is selected, said inhibiting means being inserted between said selected one main memory word line and said reference voltage and having a gate connected to the junction of said selecting means and said corresponding selected one auxiliary memory word line.

9. A semiconductor memory device for providing error correction, said memory device being coupled to a source of power, being responsive to an address signal, and comprising:
- a main memory including main memory word lines connected to different ones of a plurality of main memory cells;
- an auxiliary memory including auxiliary memory word lines;
- a decoder for decoding said address signal and for producing a decoded address signal identifying one of said main memory word lines;
- selecting means for selecting one of said main memory word lines and a corresponding one of said auxiliary memory word line according to said decoded address signal, said selecting means including a transistor circuit having first and second MOS transistors both having current paths connected in series between said corresponding selected one auxiliary memory word line and a reference voltage, said first MOS transistor having gate supplied with said address signal from said decoder and said second MOS transistor having a gate supplied with a control signal, whereby said selecting means selects said selected one main memory word line when said control signal has a first logic level and selects said corresponding selected one auxiliary memory line when said control signal has a second logic level; and
- control means for generating said control signal at said first logic level when all of said main memory cells connected to said selected one main memory word line are correct and for generating said control signal at said second logic level when any of said main memory cells connected to said selected one main memory word line is in error, said control means including
  - a high-resistance polysilicon being in a first state when all of said main memory cells connected to said selected one main memory word line are correct and being in a second state when any of said main memory cells connected to said selected one main memory line is in error, said high-resistance polysilicon having a first terminal connected to said power source, and
  - a third MOS transistor having a current path connected between another terminal of said high-resistance polysilicon and said reference voltage, and having a gate also connected to said reference voltage, the junction of said high-resistance polysilicon and said third MOS transistor being connected to the gate of said second MOS transistor.

10. A semiconductor memory device for providing error correction, said memory device being coupled to a source of power, being responsive to an address signal, and comprising:
- a main memory including main memory word lines connected to different ones of a plurality of main memory cells;
- an auxiliary memory including auxiliary memory word lines connected to different one of a plurality of main memory cells;
- an auxiliary memory including auxiliary memory word lines;
- a decoder for decoding said address signal and for producing a decoded address signal identifying one of said main memory word lines;
- selecting means for selecting one of said main memory word lines and a corresponding one of said auxiliary memory word lines according to said decoded address signal, said selecting means including a buffer circuit having
  - an inverter connected between said power source and a reference voltage and having an input terminal connected to an output terminal of said decoder; and
  - first, second, third and fourth MOS transistors having current paths connected in series between said power source and said reference voltage in the stated order from said power source, said first and third transistors having gates supplied with a control signal, said second transistor having a gate connected to said output terminal of said decoder, said fourth transistor having a gate connected to an output terminal of said inverter, and the junction of said second and third transistors forming an output terminal of said buffer means; and
- control means for generating said control signal at a first logic level when all of said memory cells connected to said selected one main memory word line are correct so that said selected one main memory word line is selected by said selecting means, and for generating said control signal at a second logic level when any of said memory cells connected to said selected one main memory word line is in error so that said corresponding selected one auxiliary memory word line is selected by said selecting means.

* * * * *